US010668816B2

(12) United States Patent
Bucknell

(10) Patent No.: US 10,668,816 B2
(45) Date of Patent: Jun. 2, 2020

(54) SOLAR EXTENDED RANGE ELECTRIC VEHICLE WITH PANEL DEPLOYMENT AND EMITTER TRACKING

(71) Applicant: DIVERGENT TECHNOLOGIES, INC., Los Angeles, CA (US)

(72) Inventor: John Russell Bucknell, El Segundo, CA (US)

(73) Assignee: DIVERGENT TECHNOLOGIES, INC., Los Angeles, CA (US)

( * ) Notice: Subject to any disclaimer, the term of this patent is extended or adjusted under 35 U.S.C. 154(b) by 0 days.

(21) Appl. No.: 15/730,685

(22) Filed: Oct. 11, 2017

(65) Prior Publication Data

US 2019/0105992 A1   Apr. 11, 2019

(51) Int. Cl.
| | | |
|---|---|---|
| *B60L 8/00* | (2006.01) | |
| *H01L 31/055* | (2014.01) | |
| *B62M 6/85* | (2010.01) | |
| *B60L 50/60* | (2019.01) | |
| *H02S 20/30* | (2014.01) | |
| *B60K 16/00* | (2020.01) | |

(52) U.S. Cl.
CPC ............... *B60L 8/003* (2013.01); *B60L 50/60* (2019.02); *B62M 6/85* (2013.01); *H01L 31/055* (2013.01); *H02S 20/30* (2014.12); *B60K 2016/003* (2013.01); *B60L 2200/22* (2013.01); *Y02T 10/7083* (2013.01)

(58) Field of Classification Search
CPC .......... B60L 8/003; B62M 6/85; B60K 16/00; B60K 2016/003
See application file for complete search history.

(56) References Cited

U.S. PATENT DOCUMENTS

| | | |
|---|---|---|
| 5,203,226 A | 4/1993 | Hongou et al. |
| 5,742,385 A | 4/1998 | Champa |
| 5,990,444 A | 11/1999 | Costin |
| 6,010,155 A | 1/2000 | Rinehart |

(Continued)

FOREIGN PATENT DOCUMENTS

| | | | | |
|---|---|---|---|---|
| FR | 2941200 A1 | * | 7/2010 | ............. B60J 11/04 |
| JP | 2010219318 A | * | 9/2010 | ............. H02S 20/32 |

(Continued)

OTHER PUBLICATIONS

US 9,809,265 B2, 11/2017, Kinjo (withdrawn)
International Search Report and Written Opinion dated Jan. 28, 2019, regarding PCT/US2018/054872.

*Primary Examiner* — James A Shriver, II
*Assistant Examiner* — Steve Clemmons
(74) *Attorney, Agent, or Firm* — Arent Fox LLP

(57) ABSTRACT

A solar extended range electric vehicle includes panel deployment and emitter tracking features. In one aspect, the vehicle includes one or more deployment motors for deploying the solar panels from their closed position upon activation of a stationary mode. In another aspect, the vehicle provides dynamic emitter tracking in the stationary mode. For example, the one or more deployment motors and/or counterpart processing systems are configured in one embodiment, to rotate, translate, or otherwise orient their respective solar panels to track the sun. The vehicle may further include a dynamic leaning suspension system as an additional or alternative emitter tracking mechanism.

25 Claims, 12 Drawing Sheets

(56) References Cited

U.S. PATENT DOCUMENTS

| | | | |
|---|---|---|---|
| 6,096,249 A | 8/2000 | Yamaguchi | |
| 6,140,602 A | 10/2000 | Costin | |
| 6,250,533 B1 | 6/2001 | Otterbein et al. | |
| 6,252,196 B1 | 6/2001 | Costin et al. | |
| 6,318,642 B1 | 11/2001 | Goenka et al. | |
| 6,365,057 B1 | 4/2002 | Whitehurst et al. | |
| 6,391,251 B1 | 5/2002 | Keicher et al. | |
| 6,409,930 B1 | 6/2002 | Whitehurst et al. | |
| 6,468,439 B1 | 10/2002 | Whitehurst et al. | |
| 6,554,345 B2 | 4/2003 | Jonsson | |
| 6,585,151 B1 | 7/2003 | Ghosh | |
| 6,644,721 B1 | 11/2003 | Miskech et al. | |
| 6,811,744 B2 | 11/2004 | Keicher et al. | |
| 6,866,497 B2 | 3/2005 | Saiki | |
| 6,919,035 B1 | 7/2005 | Clough | |
| 6,926,970 B2 | 8/2005 | James et al. | |
| 7,152,292 B2 | 12/2006 | Hohmann et al. | |
| 7,344,186 B1 | 3/2008 | Hausler et al. | |
| 7,500,373 B2 | 3/2009 | Quell | |
| 7,586,062 B2 | 9/2009 | Heberer | |
| 7,637,134 B2 | 12/2009 | Burzlaff et al. | |
| 7,710,347 B2 | 5/2010 | Gentilman et al. | |
| 7,716,802 B2 | 5/2010 | Stern et al. | |
| 7,745,293 B2 | 6/2010 | Yamazaki et al. | |
| 7,766,123 B2 | 8/2010 | Sakurai et al. | |
| 7,852,388 B2 | 12/2010 | Shimizu et al. | |
| 7,908,922 B2 | 3/2011 | Zarabadi et al. | |
| 7,951,324 B2 | 5/2011 | Naruse et al. | |
| 8,094,036 B2 | 1/2012 | Heberer | |
| 8,163,077 B2 | 4/2012 | Eron et al. | |
| 8,286,236 B2 | 10/2012 | Jung et al. | |
| 8,289,352 B2 | 10/2012 | Vartanian et al. | |
| 8,297,096 B2 | 10/2012 | Mizumura et al. | |
| 8,354,170 B1 | 1/2013 | Henry et al. | |
| 8,383,028 B2 | 2/2013 | Lyons | |
| 8,408,036 B2 | 4/2013 | Reith et al. | |
| 8,429,754 B2 | 4/2013 | Jung et al. | |
| 8,437,513 B1 | 5/2013 | Derakhshani et al. | |
| 8,444,903 B2 | 5/2013 | Lyons et al. | |
| 8,452,073 B2 | 5/2013 | Taminger et al. | |
| 8,599,301 B2 | 12/2013 | Dowski, Jr. et al. | |
| 8,606,540 B2 | 12/2013 | Haisty et al. | |
| 8,610,761 B2 | 12/2013 | Haisty et al. | |
| 8,631,996 B2 | 1/2014 | Quell et al. | |
| 8,675,925 B2 | 3/2014 | Derakhshani et al. | |
| 8,678,060 B2 | 3/2014 | Dietz et al. | |
| 8,686,314 B2 | 4/2014 | Schneegans et al. | |
| 8,686,997 B2 | 4/2014 | Radet et al. | |
| 8,694,284 B2 | 4/2014 | Berard | |
| 8,701,800 B2 * | 4/2014 | Hui | B60K 16/00 180/2.2 |
| 8,720,876 B2 | 5/2014 | Reith et al. | |
| 8,752,166 B2 | 6/2014 | Jung et al. | |
| 8,755,923 B2 | 6/2014 | Farahani et al. | |
| 8,787,628 B1 | 7/2014 | Derakhshani et al. | |
| 8,818,771 B2 | 8/2014 | Gielis et al. | |
| 8,851,560 B1 * | 10/2014 | Freeman | B60J 11/04 296/210 |
| 8,873,238 B2 | 10/2014 | Wilkins | |
| 8,886,379 B2 * | 11/2014 | Freeman | B60L 8/003 180/165 |
| 8,978,535 B2 | 3/2015 | Ortiz et al. | |
| 9,006,605 B2 | 4/2015 | Schneegans et al. | |
| 9,071,436 B2 | 6/2015 | Jung et al. | |
| 9,101,979 B2 | 8/2015 | Hofmann et al. | |
| 9,104,921 B2 | 8/2015 | Derakhshani et al. | |
| 9,126,365 B1 | 9/2015 | Mark et al. | |
| 9,128,476 B2 | 9/2015 | Jung et al. | |
| 9,138,924 B2 | 9/2015 | Yen | |
| 9,149,988 B2 | 10/2015 | Mark et al. | |
| 9,156,205 B2 | 10/2015 | Mark et al. | |
| 9,186,848 B2 | 11/2015 | Mark et al. | |
| 9,244,986 B2 | 1/2016 | Karmarkar | |
| 9,248,611 B2 | 2/2016 | Divine et al. | |
| 9,254,535 B2 | 2/2016 | Buller et al. | |
| 9,266,566 B2 | 2/2016 | Kim | |
| 9,269,022 B2 | 2/2016 | Rhoads et al. | |
| 9,327,452 B2 | 5/2016 | Mark et al. | |
| 9,329,020 B1 | 5/2016 | Napoletano | |
| 9,332,251 B2 | 5/2016 | Haisty et al. | |
| 9,346,127 B2 | 5/2016 | Buller et al. | |
| 9,389,315 B2 | 7/2016 | Bruder et al. | |
| 9,399,256 B2 | 7/2016 | Buller et al. | |
| 9,403,235 B2 | 8/2016 | Buller et al. | |
| 9,418,193 B2 | 8/2016 | Dowski, Jr. et al. | |
| 9,457,514 B2 | 10/2016 | Schwärzler | |
| 9,469,057 B2 | 10/2016 | Johnson et al. | |
| 9,478,063 B2 | 10/2016 | Rhoads et al. | |
| 9,481,402 B1 | 11/2016 | Muto et al. | |
| 9,486,878 B2 | 11/2016 | Buller et al. | |
| 9,486,960 B2 | 11/2016 | Paschkewitz et al. | |
| 9,502,993 B2 | 11/2016 | Deng | |
| 9,525,262 B2 | 12/2016 | Stuart et al. | |
| 9,533,526 B1 | 1/2017 | Nevins | |
| 9,555,315 B2 | 1/2017 | Aders | |
| 9,555,580 B1 | 1/2017 | Dykstra et al. | |
| 9,557,856 B2 | 1/2017 | Send et al. | |
| 9,566,742 B2 | 2/2017 | Keating et al. | |
| 9,566,758 B2 | 2/2017 | Cheung et al. | |
| 9,567,013 B2 | 2/2017 | Ehrlich et al. | |
| 9,573,193 B2 | 2/2017 | Buller et al. | |
| 9,573,225 B2 | 2/2017 | Buller et al. | |
| 9,586,290 B2 | 3/2017 | Buller et al. | |
| 9,595,795 B2 | 3/2017 | Lane et al. | |
| 9,597,843 B2 | 3/2017 | Stauffer et al. | |
| 9,600,929 B1 | 3/2017 | Young et al. | |
| 9,609,755 B2 | 3/2017 | Coull et al. | |
| 9,610,737 B2 | 4/2017 | Johnson et al. | |
| 9,611,667 B2 | 4/2017 | GangaRao et al. | |
| 9,616,623 B2 | 4/2017 | Johnson et al. | |
| 9,626,487 B2 | 4/2017 | Jung et al. | |
| 9,626,489 B2 | 4/2017 | Nilsson | |
| 9,643,361 B2 | 5/2017 | Liu | |
| 9,662,840 B1 | 5/2017 | Buller et al. | |
| 9,665,182 B2 | 5/2017 | Send et al. | |
| 9,672,389 B1 | 6/2017 | Mosterman et al. | |
| 9,672,550 B2 | 6/2017 | Apsley et al. | |
| 9,676,145 B2 | 6/2017 | Buller et al. | |
| 9,684,919 B2 | 6/2017 | Apsley et al. | |
| 9,688,032 B2 | 6/2017 | Kia et al. | |
| 9,690,286 B2 | 6/2017 | Hovsepian et al. | |
| 9,700,966 B2 | 7/2017 | Kraft et al. | |
| 9,703,896 B2 | 7/2017 | Zhang et al. | |
| 9,713,903 B2 | 7/2017 | Paschkewitz et al. | |
| 9,718,302 B2 | 8/2017 | Young et al. | |
| 9,718,434 B2 | 8/2017 | Hector, Jr. et al. | |
| 9,724,877 B2 | 8/2017 | Flitsch et al. | |
| 9,724,881 B2 | 8/2017 | Johnson et al. | |
| 9,725,178 B2 | 8/2017 | Wang | |
| 9,731,730 B2 | 8/2017 | Stiles | |
| 9,731,773 B2 | 8/2017 | Gami et al. | |
| 9,741,954 B2 | 8/2017 | Bruder et al. | |
| 9,747,352 B2 | 8/2017 | Karmarkar | |
| 9,764,415 B2 | 9/2017 | Seufzer et al. | |
| 9,764,520 B2 | 9/2017 | Johnson et al. | |
| 9,765,226 B2 | 9/2017 | Dain | |
| 9,770,760 B2 | 9/2017 | Liu | |
| 9,773,393 B2 | 9/2017 | Velez | |
| 9,776,234 B2 | 10/2017 | Schaafhausen et al. | |
| 9,782,936 B2 | 10/2017 | Glunz et al. | |
| 9,783,324 B2 | 10/2017 | Embler et al. | |
| 9,783,977 B2 | 10/2017 | Alqasimi et al. | |
| 9,789,548 B2 | 10/2017 | Golshany et al. | |
| 9,789,922 B2 | 10/2017 | Dosenbach et al. | |
| 9,796,137 B2 | 10/2017 | Zhang et al. | |
| 9,802,108 B2 | 10/2017 | Aders | |
| 9,809,977 B2 | 11/2017 | Carney et al. | |
| 9,817,922 B2 | 11/2017 | Glunz et al. | |
| 9,818,071 B2 | 11/2017 | Jung et al. | |
| 9,821,339 B2 | 11/2017 | Paschkewitz et al. | |
| 9,821,411 B2 | 11/2017 | Buller et al. | |
| 9,823,143 B2 | 11/2017 | Twelves, Jr. et al. | |
| 9,829,564 B2 | 11/2017 | Bruder et al. | |
| 9,831,819 B2 * | 11/2017 | Kirk | H02S 20/32 |

(56) References Cited

U.S. PATENT DOCUMENTS

| | | |
|---|---|---|
| 9,846,933 B2 | 12/2017 | Yuksel |
| 9,854,828 B2 | 1/2018 | Langeland |
| 9,858,604 B2 | 1/2018 | Apsley et al. |
| 9,862,833 B2 | 1/2018 | Hasegawa et al. |
| 9,862,834 B2 | 1/2018 | Hasegawa et al. |
| 9,863,885 B2 | 1/2018 | Zaretski et al. |
| 9,870,629 B2 | 1/2018 | Cardno et al. |
| 9,879,981 B1 | 1/2018 | Dehghan Niri et al. |
| 9,884,663 B2 | 2/2018 | Czinger et al. |
| 9,898,776 B2 | 2/2018 | Apsley et al. |
| 9,914,150 B2 | 3/2018 | Pettersson et al. |
| 9,919,360 B2 | 3/2018 | Buller et al. |
| 9,931,697 B2 | 4/2018 | Levin et al. |
| 9,933,031 B2 | 4/2018 | Bracamonte et al. |
| 9,933,092 B2 | 4/2018 | Sindelar |
| 9,957,031 B2 | 5/2018 | Golshany et al. |
| 9,958,535 B2 | 5/2018 | Send et al. |
| 9,962,767 B2 | 5/2018 | Buller et al. |
| 9,963,978 B2 | 5/2018 | Johnson et al. |
| 9,971,920 B2 | 5/2018 | Derakhshani et al. |
| 9,976,063 B2 | 5/2018 | Childers et al. |
| 9,987,792 B2 | 6/2018 | Flitsch et al. |
| 9,988,136 B2 | 6/2018 | Tiryaki et al. |
| 9,989,623 B2 | 6/2018 | Send et al. |
| 9,990,565 B2 | 6/2018 | Rhoads et al. |
| 9,994,339 B2 | 6/2018 | Colson et al. |
| 9,996,890 B1 | 6/2018 | Cinnamon et al. |
| 9,996,945 B1 | 6/2018 | Holzer et al. |
| 10,002,215 B2 | 6/2018 | Dowski et al. |
| 10,006,156 B2 | 6/2018 | Kirkpatrick |
| 10,011,089 B2 | 7/2018 | Lyons et al. |
| 10,011,685 B2 | 7/2018 | Childers et al. |
| 10,012,532 B2 | 7/2018 | Send et al. |
| 10,013,777 B2 | 7/2018 | Mariampillai et al. |
| 10,015,908 B2 | 7/2018 | Williams et al. |
| 10,016,852 B2 | 7/2018 | Broda |
| 10,016,942 B2 | 7/2018 | Mark et al. |
| 10,017,384 B1 | 7/2018 | Greer et al. |
| 10,018,576 B2 | 7/2018 | Herbsommer et al. |
| 10,022,792 B2 | 7/2018 | Srivas et al. |
| 10,022,912 B2 | 7/2018 | Kia et al. |
| 10,027,376 B2 | 7/2018 | Sankaran et al. |
| 10,029,415 B2 | 7/2018 | Swanson et al. |
| 10,040,239 B2 | 8/2018 | Brown, Jr. |
| 10,046,412 B2 | 8/2018 | Blackmore |
| 10,048,769 B2 | 8/2018 | Selker et al. |
| 10,052,712 B2 | 8/2018 | Blackmore |
| 10,052,820 B2 | 8/2018 | Kemmer et al. |
| 10,055,536 B2 | 8/2018 | Maes et al. |
| 10,058,764 B2 | 8/2018 | Aders |
| 10,058,920 B2 | 8/2018 | Buller et al. |
| 10,061,906 B2 | 8/2018 | Nilsson |
| 10,065,270 B2 | 9/2018 | Buller et al. |
| 10,065,361 B2 | 9/2018 | Susnjara et al. |
| 10,065,367 B2 | 9/2018 | Brown, Jr. |
| 10,068,316 B1 | 9/2018 | Holzer et al. |
| 10,071,422 B2 | 9/2018 | Buller et al. |
| 10,071,525 B2 | 9/2018 | Susnjara et al. |
| 10,072,179 B2 | 9/2018 | Drijfhout |
| 10,074,128 B2 | 9/2018 | Colson et al. |
| 10,076,875 B2 | 9/2018 | Mark et al. |
| 10,076,876 B2 | 9/2018 | Mark et al. |
| 10,081,140 B2 | 9/2018 | Paesano et al. |
| 10,081,431 B2 | 9/2018 | Seack et al. |
| 10,086,568 B2 | 10/2018 | Snyder et al. |
| 10,087,320 B2 | 10/2018 | Simmons et al. |
| 10,087,556 B2 | 10/2018 | Gallucci et al. |
| 10,099,427 B2 | 10/2018 | Mark et al. |
| 10,100,542 B2 | 10/2018 | GangaRao et al. |
| 10,100,890 B2 | 10/2018 | Bracamonte et al. |
| 10,107,344 B2 | 10/2018 | Bracamonte et al. |
| 10,108,766 B2 | 10/2018 | Druckman et al. |
| 10,113,600 B2 | 10/2018 | Bracamonte et al. |
| 10,118,347 B2 | 11/2018 | Stauffer et al. |
| 10,118,579 B2 | 11/2018 | Lakic |
| 10,120,078 B2 | 11/2018 | Bruder et al. |
| 10,124,546 B2 | 11/2018 | Johnson et al. |
| 10,124,570 B2 | 11/2018 | Evans et al. |
| 10,137,500 B2 | 11/2018 | Blackmore |
| 10,138,354 B2 | 11/2018 | Groos et al. |
| 10,144,126 B2 | 12/2018 | Krohne et al. |
| 10,145,110 B2 | 12/2018 | Carney et al. |
| 10,151,363 B2 | 12/2018 | Bracamonte et al. |
| 10,152,661 B2 | 12/2018 | Kieser |
| 10,160,278 B2 | 12/2018 | Coombs et al. |
| 10,161,021 B2 | 12/2018 | Lin et al. |
| 10,166,752 B2 | 1/2019 | Evans et al. |
| 10,166,753 B2 | 1/2019 | Evans et al. |
| 10,171,578 B1 | 1/2019 | Cook et al. |
| 10,173,255 B2 | 1/2019 | TenHouten et al. |
| 10,173,327 B2 | 1/2019 | Kraft et al. |
| 10,178,800 B2 | 1/2019 | Mahalingam et al. |
| 10,179,640 B2 | 1/2019 | Wilkerson |
| 10,183,330 B2 | 1/2019 | Buller et al. |
| 10,183,478 B2 | 1/2019 | Evans et al. |
| 10,189,187 B2 | 1/2019 | Keating et al. |
| 10,189,240 B2 | 1/2019 | Evans et al. |
| 10,189,241 B2 | 1/2019 | Evans et al. |
| 10,189,242 B2 | 1/2019 | Evans et al. |
| 10,190,424 B2 | 1/2019 | Johnson et al. |
| 10,195,693 B2 | 2/2019 | Buller et al. |
| 10,196,539 B2 | 2/2019 | Boonen et al. |
| 10,197,338 B2 | 2/2019 | Melsheimer |
| 10,200,677 B2 | 2/2019 | Trevor et al. |
| 10,201,932 B2 | 2/2019 | Flitsch et al. |
| 10,201,941 B2 | 2/2019 | Evans et al. |
| 10,202,673 B2 | 2/2019 | Lin et al. |
| 10,204,216 B2 | 2/2019 | Nejati et al. |
| 10,207,454 B2 | 2/2019 | Buller et al. |
| 10,209,065 B2 | 2/2019 | Estevo, Jr. et al. |
| 10,210,662 B2 | 2/2019 | Holzer et al. |
| 10,213,837 B2 | 2/2019 | Kondoh |
| 10,214,248 B2 | 2/2019 | Hall et al. |
| 10,214,252 B2 | 2/2019 | Schellekens et al. |
| 10,214,275 B2 | 2/2019 | Goehlich |
| 10,220,575 B2 | 3/2019 | Reznar |
| 10,220,881 B2 | 3/2019 | Tyan et al. |
| 10,221,530 B2 | 3/2019 | Driskell et al. |
| 10,226,900 B1 | 3/2019 | Nevins |
| 10,232,550 B2 | 3/2019 | Evans et al. |
| 10,234,342 B2 | 3/2019 | Moorlag et al. |
| 10,237,477 B2 | 3/2019 | Trevor et al. |
| 10,252,335 B2 | 4/2019 | Buller et al. |
| 10,252,336 B2 | 4/2019 | Buller et al. |
| 10,254,499 B1 | 4/2019 | Cohen et al. |
| 10,257,499 B2 | 4/2019 | Hintz et al. |
| 10,259,044 B2 | 4/2019 | Buller et al. |
| 10,268,181 B1 | 4/2019 | Nevins |
| 10,269,225 B2 | 4/2019 | Velez |
| 10,272,786 B2 * | 4/2019 | Schneider ............... B60L 8/003 |
| 10,272,860 B2 | 4/2019 | Mohapatra et al. |
| 10,272,862 B2 | 4/2019 | Whitehead |
| 10,275,564 B2 | 4/2019 | Ridgeway et al. |
| 10,279,580 B2 | 5/2019 | Evans et al. |
| 10,285,219 B2 | 5/2019 | Fetfatsidis et al. |
| 10,286,452 B2 | 5/2019 | Buller et al. |
| 10,286,603 B2 | 5/2019 | Buller et al. |
| 10,286,961 B2 | 5/2019 | Hillebrecht et al. |
| 10,289,263 B2 | 5/2019 | Troy et al. |
| 10,289,875 B2 | 5/2019 | Singh et al. |
| 10,291,193 B2 | 5/2019 | Dandu et al. |
| 10,294,552 B2 | 5/2019 | Liu et al. |
| 10,294,982 B2 | 5/2019 | Gabrys et al. |
| 10,295,989 B1 | 5/2019 | Nevins |
| 10,303,159 B2 | 5/2019 | Czinger et al. |
| 10,307,824 B2 | 6/2019 | Kondoh |
| 10,310,197 B1 | 6/2019 | Droz et al. |
| 10,313,651 B2 | 6/2019 | Trevor et al. |
| 10,315,252 B2 | 6/2019 | Mendelsberg et al. |
| 10,336,050 B2 | 7/2019 | Susnjara |
| 10,337,542 B2 | 7/2019 | Hesslewood et al. |
| 10,337,952 B2 | 7/2019 | Bosetti et al. |
| 10,339,266 B2 | 7/2019 | Urick et al. |
| 10,343,330 B2 | 7/2019 | Evans et al. |

(56) References Cited

U.S. PATENT DOCUMENTS

| | | | |
|---|---|---|---|
| 10,343,331 B2 | 7/2019 | McCall et al. | |
| 10,343,355 B2 | 7/2019 | Evans et al. | |
| 10,343,724 B2 | 7/2019 | Polewarczyk et al. | |
| 10,343,725 B2 | 7/2019 | Martin et al. | |
| 10,350,823 B2 | 7/2019 | Rolland et al. | |
| 10,356,341 B2 | 7/2019 | Holzer et al. | |
| 10,356,395 B2 | 7/2019 | Holzer et al. | |
| 10,357,829 B2 | 7/2019 | Spink et al. | |
| 10,357,957 B2 | 7/2019 | Buller et al. | |
| 10,359,756 B2 | 7/2019 | Newell et al. | |
| 10,369,629 B2 | 8/2019 | Mendelsberg et al. | |
| 10,382,739 B1 | 8/2019 | Rusu et al. | |
| 10,384,393 B2 | 8/2019 | Xu et al. | |
| 10,384,416 B2 | 8/2019 | Cheung et al. | |
| 10,389,410 B2 | 8/2019 | Brooks et al. | |
| 10,391,710 B2 | 8/2019 | Mondesir | |
| 10,392,097 B2 | 8/2019 | Pham et al. | |
| 10,392,131 B2 | 8/2019 | Deck et al. | |
| 10,393,315 B2 | 8/2019 | Tyan | |
| 10,400,080 B2 | 9/2019 | Ramakrishnan et al. | |
| 10,401,832 B2 | 9/2019 | Snyder et al. | |
| 10,403,009 B2 | 9/2019 | Mariampillai et al. | |
| 10,406,750 B2 | 9/2019 | Barton et al. | |
| 10,412,283 B2 | 9/2019 | Send et al. | |
| 10,416,095 B2 | 9/2019 | Herbsommer et al. | |
| 10,421,496 B2 | 9/2019 | Swayne et al. | |
| 10,421,863 B2 | 9/2019 | Hasegawa et al. | |
| 10,422,478 B2 | 9/2019 | Leachman et al. | |
| 10,425,793 B2 | 9/2019 | Sankaran et al. | |
| 10,427,364 B2 | 10/2019 | Alves | |
| 10,429,006 B2 | 10/2019 | Tyan et al. | |
| 10,434,573 B2 | 10/2019 | Buller et al. | |
| 10,435,185 B2 | 10/2019 | Divine et al. | |
| 10,435,773 B2 | 10/2019 | Liu et al. | |
| 10,436,038 B2 | 10/2019 | Buhler et al. | |
| 10,438,407 B2 | 10/2019 | Pavanaskar et al. | |
| 10,439,549 B2 * | 10/2019 | Kurlagunda | B60L 8/003 |
| 10,440,351 B2 | 10/2019 | Holzer et al. | |
| 10,442,002 B2 | 10/2019 | Benthien et al. | |
| 10,442,003 B2 | 10/2019 | Symeonidis et al. | |
| 10,449,696 B2 | 10/2019 | Elgar et al. | |
| 10,449,737 B2 | 10/2019 | Johnson et al. | |
| 10,461,810 B2 | 10/2019 | Cook et al. | |
| 2006/0108783 A1 | 5/2006 | Ni et al. | |
| 2008/0100258 A1 * | 5/2008 | Ward | H01M 10/465 320/101 |
| 2009/0288891 A1 * | 11/2009 | Budge | B60K 16/00 180/2.2 |
| 2010/0084208 A1 * | 4/2010 | Chen | B60L 11/1881 180/65.31 |
| 2010/0193260 A1 * | 8/2010 | Freeman | B60K 16/00 180/2.2 |
| 2010/0193261 A1 * | 8/2010 | Freeman | B60K 16/00 180/2.2 |
| 2011/0079166 A1 | 4/2011 | Popa-Simil | |
| 2012/0073885 A1 * | 3/2012 | Glynn | B60K 16/00 180/2.2 |
| 2013/0057023 A1 * | 3/2013 | Kim | G05D 3/105 296/181.1 |
| 2013/0081892 A1 * | 4/2013 | Kronfeld | B60L 7/12 180/210 |
| 2013/0270016 A1 * | 10/2013 | Donnell | B60K 16/00 180/2.2 |
| 2014/0028240 A1 * | 1/2014 | Heumann | H02J 7/0052 320/101 |
| 2014/0277669 A1 | 9/2014 | Nardi et al. | |
| 2014/0297072 A1 * | 10/2014 | Freeman | B60L 8/003 701/22 |
| 2016/0126886 A1 * | 5/2016 | Eo | H02S 20/30 296/216.04 |
| 2017/0113344 A1 | 4/2017 | Schönberg | |
| 2017/0341309 A1 | 11/2017 | Piepenbrock et al. | |
| 2018/0326853 A1 * | 11/2018 | Bemont | B60K 16/00 |
| 2018/0367083 A1 * | 12/2018 | Wang | B60L 8/003 |

FOREIGN PATENT DOCUMENTS

| | | | |
|---|---|---|---|
| WO | 1996036455 A1 | 11/1996 | |
| WO | 1996036525 A1 | 11/1996 | |
| WO | 1996038260 A1 | 12/1996 | |
| WO | 2003024641 A1 | 3/2003 | |
| WO | 2004108343 A1 | 12/2004 | |
| WO | 2005093773 A1 | 10/2005 | |
| WO | 2007003375 A1 | 1/2007 | |
| WO | 2007110235 A1 | 10/2007 | |
| WO | 2007110236 A1 | 10/2007 | |
| WO | 2008019847 A1 | 2/2008 | |
| WO | 2007128586 A3 | 6/2008 | |
| WO | 2008068314 A2 | 6/2008 | |
| WO | 2008086994 A1 | 7/2008 | |
| WO | 2008087024 A1 | 7/2008 | |
| WO | 2008107130 A1 | 9/2008 | |
| WO | 2008138503 A1 | 11/2008 | |
| WO | 2008145396 A1 | 12/2008 | |
| WO | 2009083609 A2 | 7/2009 | |
| WO | 2009098285 A1 | 8/2009 | |
| WO | 2009112520 A1 | 9/2009 | |
| WO | 2009135938 A1 | 11/2009 | |
| WO | 2009140977 A1 | 11/2009 | |
| WO | 2010125057 A2 | 11/2010 | |
| WO | 2010125058 A1 | 11/2010 | |
| WO | 2010142703 A2 | 12/2010 | |
| WO | WO-2010150309 A1 * | 12/2010 | B60L 8/003 |
| WO | 2011032533 A1 | 3/2011 | |
| WO | 2014016437 A1 | 1/2014 | |
| WO | 2014187720 A1 | 11/2014 | |
| WO | 2014195340 A1 | 12/2014 | |
| WO | 2015193331 A1 | 12/2015 | |
| WO | 2016116414 A1 | 7/2016 | |
| WO | 2017033105 A1 | 3/2017 | |
| WO | 2017036461 A1 | 3/2017 | |
| WO | 2019030248 A1 | 2/2019 | |
| WO | 2019042504 A1 | 3/2019 | |
| WO | 2019048010 A1 | 3/2019 | |
| WO | 2019048498 A1 | 3/2019 | |
| WO | 2019048680 A1 | 3/2019 | |
| WO | 2019048682 A1 | 3/2019 | |

* cited by examiner

SOLAR EXTENDED RANGE ELECTRIC VEHICLE WITH PANEL DEPLOYMENT AND EMITTER TRACKING

BACKGROUND

Field

The present disclosure relates generally to transport structures, and more specifically to vehicles that use solar panels for extending vehicle range.

Background

In light of the recent proliferation of numerous additive manufacturing (AM) (i.e., 3-D printing) processes that beneficially complement conventional machining techniques in the automotive industry, automobile manufacturers are understandably eager to pursue the development of technologies inspired by such processes. One arena that has often lead to challenges is the use of solar energy as part of a viable solution in transport structures. Conventional approaches to developing solar-powered cars have been circumscribed by practical limitations including, most fundamentally, the ability to harness adequate amounts of solar energy given the limited vehicle surface area, and the ability to generate sufficient energy to power the vehicle and to overcome the significant drag when the vehicle is in motion.

Manufactures have also considered vehicles that use solar energy to augment, rather than replace, gas or electric systems. However, these conventional approaches remain problematic. Any benefits derived from partial solar harnessing efforts have, similar to "solar-only" approaches, been undermined by the intrinsic constraints of size and drag.

The solar extended range vehicle described herein, and the features and functions included within it, represent a solution to these and other longstanding problems.

SUMMARY

Several aspects of solar-powered extended range vehicles, structures and assemblies used in these vehicles, and techniques for additively manufacturing such structures and assemblies will be described more fully hereinafter with reference to various illustrative aspects of the present disclosure.

In one aspect of the present disclosure, a solar extended-range vehicle includes at least one solar panel arranged along a vehicle frame, a battery for storing electric charge received from the at least one solar panel, and a deployment motor configured to deploy the at least one solar panel to an open position corresponding to a stationary mode.

In another aspect of the present disclosure, a solar extended-range vehicle includes a vehicle frame having a base, an array of solar panels arranged along the vehicle frame, a suspension system coupled to the base, and at least one deployment motor for deploying the array of solar panels during a stationary mode and closing the array of solar panels during a mobile mode.

Different solar-powered extended range vehicles, structures and assembly techniques may be described that have not previously been developed or proposed. It will be understood that other aspects of these vehicles, structures and techniques will become readily apparent to those skilled in the art based on the following detailed description, wherein only several embodiments are described by way of illustration. As will be appreciated by those skilled in the art, these vehicles, structures and techniques using 3D printed components can be realized with other embodiments without departing from the spirit and scope of the invention. Accordingly, the drawings and detailed description are to be regarded as illustrative in nature and not as restrictive.

BRIEF DESCRIPTION OF THE DRAWINGS

Various solar-powered extended vehicles and features will now be presented in the detailed description by way of example, and not by way of limitation, in the accompanying drawings, wherein.

DETAILED DESCRIPTION

Figure 1:
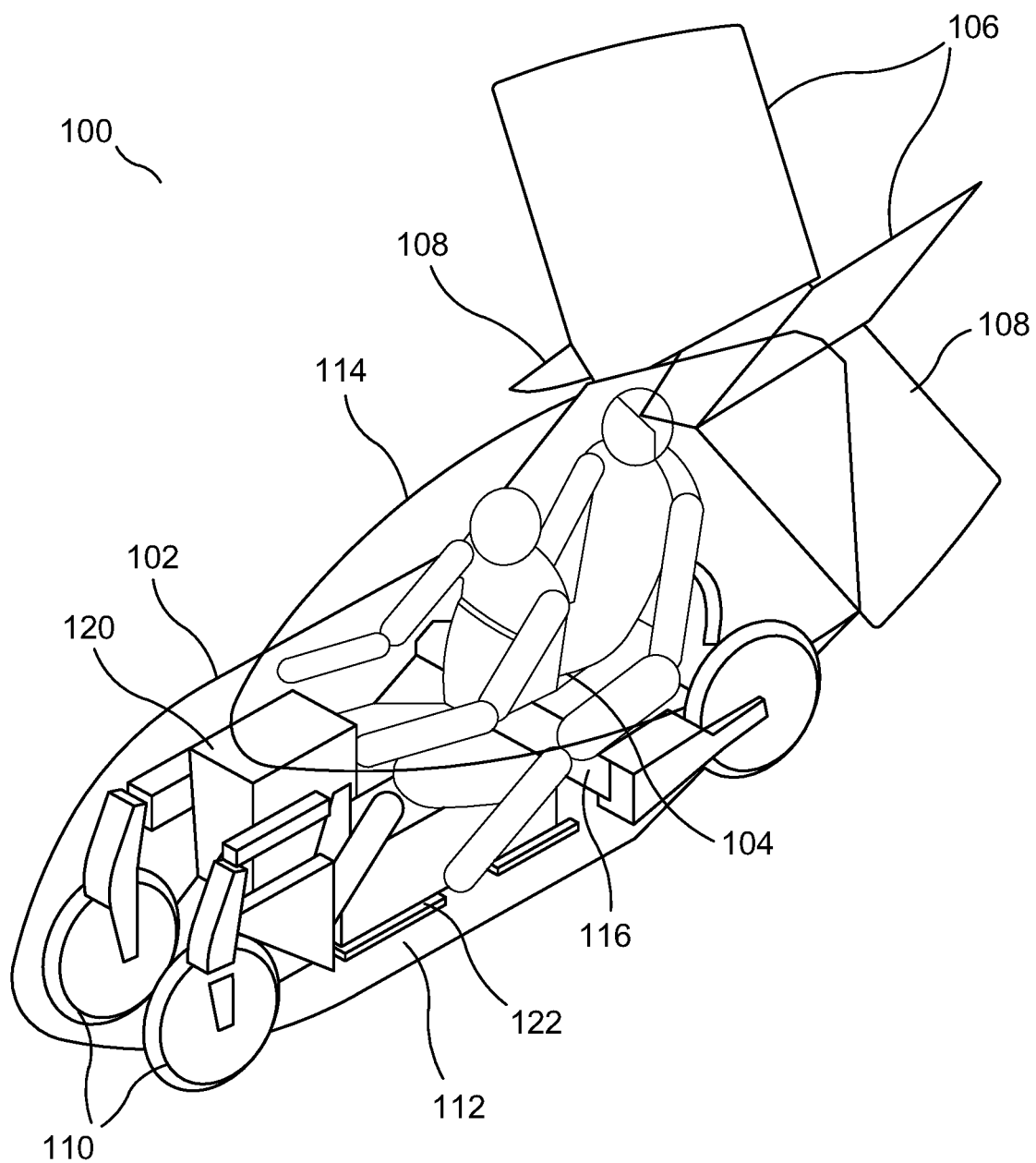
FIG. 1 is a perspective view of a solar extended range electric vehicle.

The detailed description set forth below with reference to the appended drawings is intended to provide a description of exemplary embodiments of solar-powered extended range vehicles and techniques for solar panel deployment and emitter tracking. The description is not intended to represent the only embodiments in which the invention may be practiced. The term "exemplary" used throughout this disclosure means "serving as an example, instance, or illustration," and should not necessarily be construed as preferred or advantageous over other embodiments presented in this disclosure. The detailed description includes specific details for providing a thorough and complete disclosure that fully conveys the scope of the invention to those skilled in the art. However, the invention may be practiced without these specific details. In some instances, well-known structures and components may be shown in block diagram form, or omitted entirely, to avoid obscuring the various concepts presented throughout this disclosure.

Aspects of the present disclosure include improved vehicles powered at least in part using solar energy. As noted above, prior design approaches have been problematic. Previous development attempts include covering the vehicles with numerous static solar panels mounted to the vehicle. One problem with this approach is that solar absorption capacity is limited by the deviation of solar rays from the optimal orthogonal direction from the solar emitter to a plane of the solar panel. The greater the deviation, the more pronounced the deficiency. Because the solar panels in these conventional approaches are typically stationary and flush against the vehicle frame to limit drag, there is no control over orientation of the panels, which cannot be optimized relative to a direction of the sun. Moreover, each solar panel on the static array contributes to the overall mass of the vehicle, which in turn contributes to higher energy requirements. These factors generally result in poor overall solar absorption.

Related conventional approaches include the development of vehicles in which the panels are spread out into arrays having a significant surface area in relation to the vehicle and a plurality of orientations relative to the emitter such that at any given time of day, at least some of the panels would likely be exposed to more direct sunlight. In addition to the mass added by the arrays, the aerodynamic drag force on these vehicles is so high that the amount of energy required to power these vehicles is prohibitively high. Accordingly, in one aspect of the present disclosure, a solar extended range electric vehicle is disclosed in which a deployment motor is used to deploy and stow the solar panels such that the solar panels may optimally receive a near maximum amount of solar energy. The solar vehicle itself may be electric-powered, and chargeable via an extension cord or at a charging station. The vehicle may include solar panels for supplying additional electrical energy to the battery. The range of the electric vehicle may be increased or extended by solar charging the battery, resulting in one embodiment in an extended range of at least 40 miles per day, and in other embodiments even longer ranges.

In one embodiment, multi-axis solar tracking is used when the solar vehicle is stationary so that the solar panels are positioned optimally to receive a maximum area of solar energy. Optimal position may occur when the rays of the emitter are normal to a plane of the solar panel. When the vehicle is mobile, the panels may be folded flush along the frame to minimize drag on the vehicle while being driven. The folded panels may be used while the vehicle is moving to continue to absorb solar energy.

FIG. 1 is a perspective view of a solar extended range electric vehicle 100. The vehicle 100 may include an aerodynamically contoured frame 102, a transparent or semi-transparent canopy 114, a body structure 112, a suspension system 116 mounted to the body structure 112, center console 120, battery cells 122, and dual inline seating 104 to accommodate two occupants in this embodiment.

In addition, two solar panels 106 may be located on either side of the tail in a deployable array, which in this embodiment is a total area of three square meters. Solar panels 106 may provide sufficient energy for tasks like commuting and when folded or stowed to their original position, low drag. Additional solar panels 108 beneath primary array of solar panels 106 can provide additional energy when the sun is low in the sky with the vehicle oriented mostly along the North-South direction. Two-axis solar tracking can improve Array Effectiveness by a multiple in the range of 1.3-1.8.

Figure 2A:
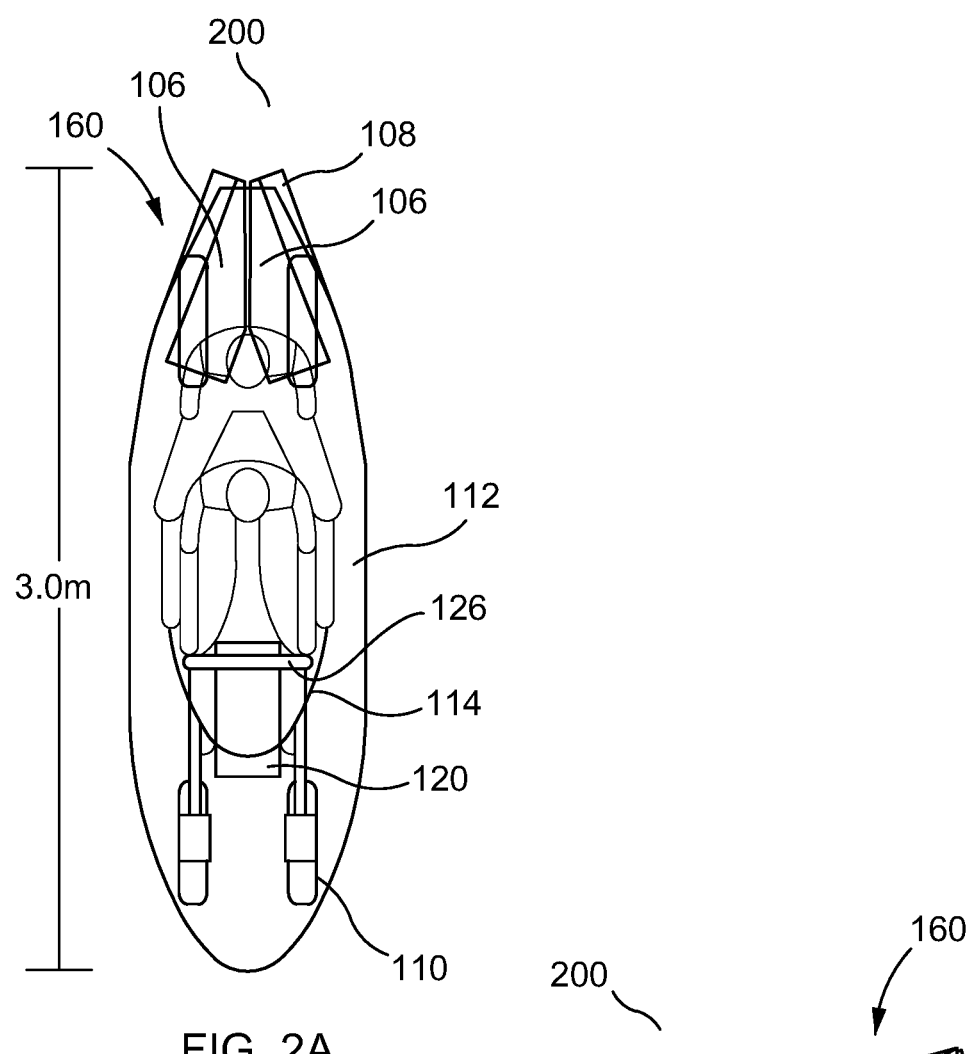
FIG. 2A is a plan view of a solar extended range electric vehicle in mobile mode.
Figure 2B:
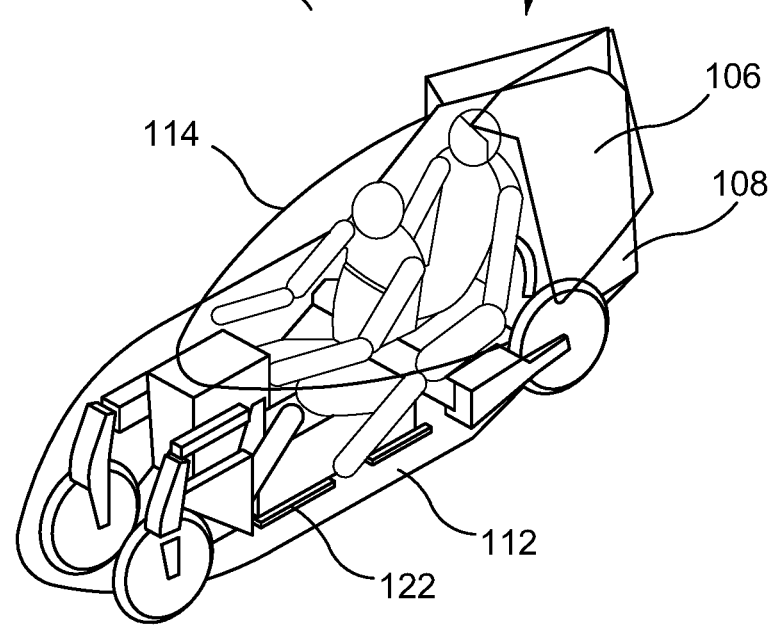
FIG. 2B is a perspective view of the solar extended range electric vehicle in mobile mode.
Figure 2C:
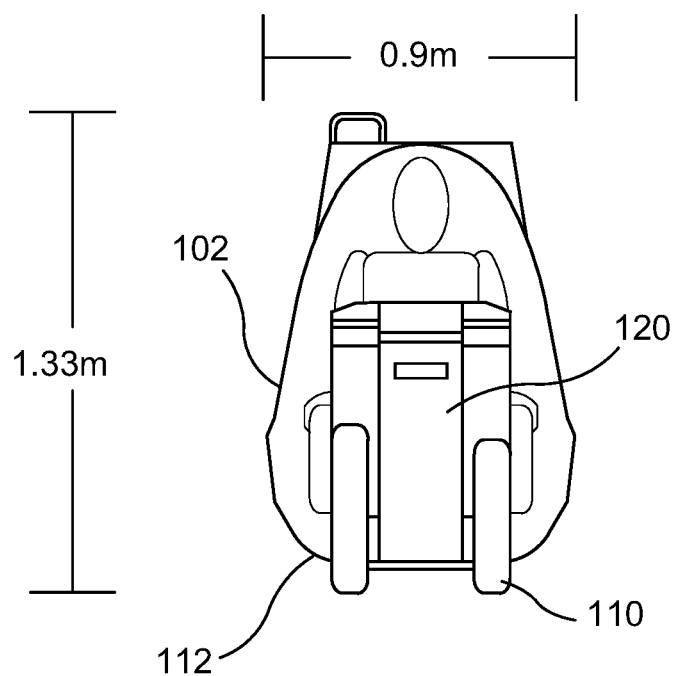
FIG. 2C is a front view of the solar extended range electric vehicle in mobile mode.

FIGS. 2A-D are respective plan, perspective, front and side views of a solar extended range electric vehicle 200 in mobile mode. As can be seen in FIGS. 2A and 2C, the vehicle 200 in this embodiment is 3.0 meters long, 1.33 meters high, and 0.9 meters wide. Particularly as shown if FIGS. 2A-B, the solar panels 106 and 108 are stowable by being foldable substantially flush against tail section 160 of the vehicle 200. Thus, to deactivate the solar panels and prepare for a more aerodynamically friendly mobile mode, lower solar panels 108 may first be folded downward flush along a frame 102 (FIG. 2C) of tail section 160. Thereupon, upper panels 106 may next be folded downward flush along lower panels 108. In this way, the amount of surface area and hence the drag decreases substantially, and the vehicle 200 is ready to be driven.

Figure 2D:
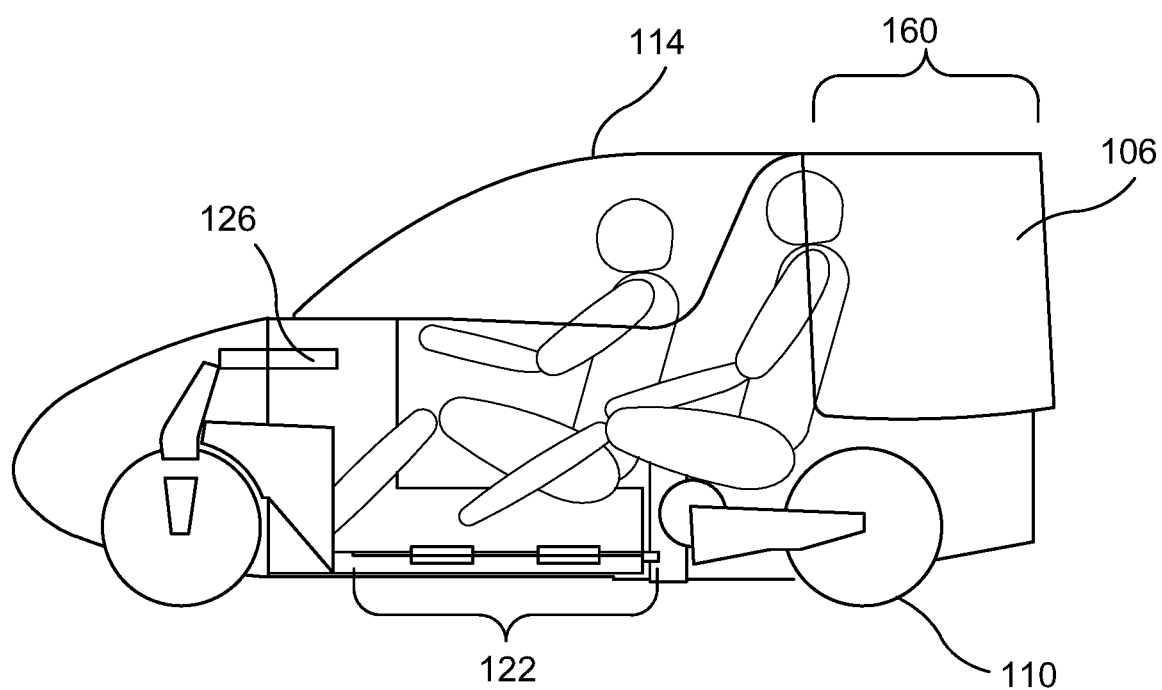
FIG. 2D is a side view of the solar extended range electric vehicle in mobile mode.
Figure 3A:
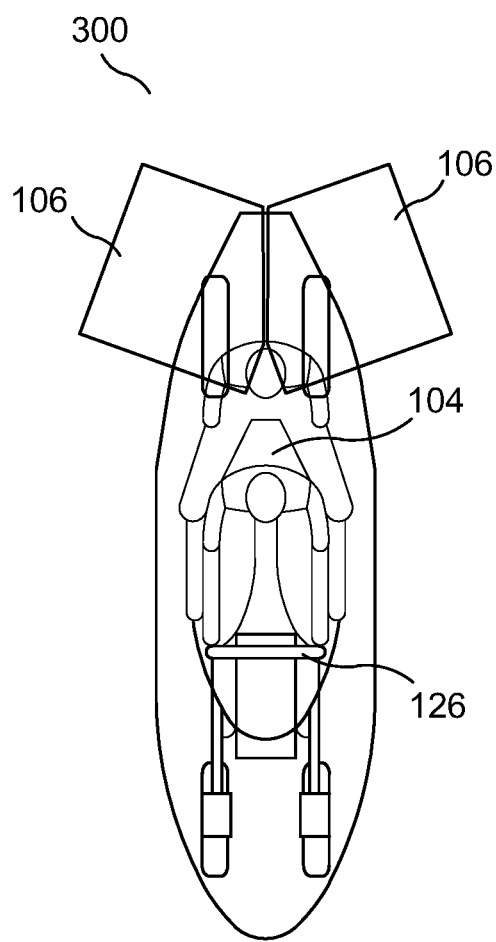
FIG. 3A is a plan view of a solar extended range electric vehicle in stationary mode.
Figure 3B:
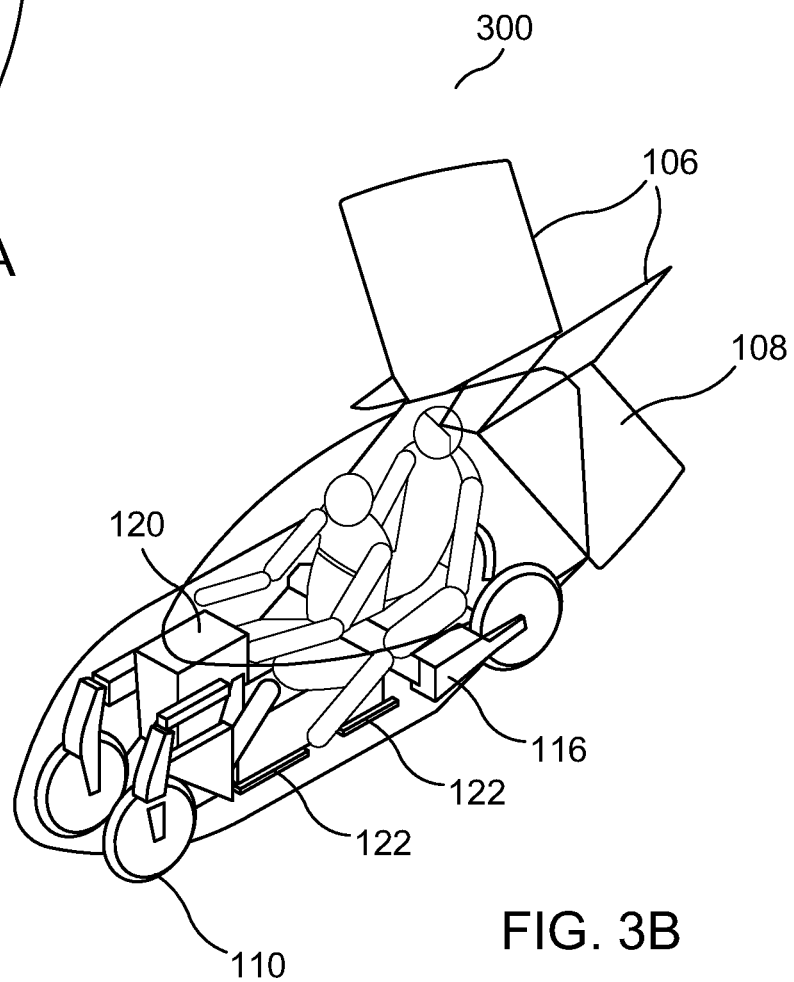
FIG. 3B is a perspective view of the solar extended range electric vehicle in stationary mode.
Figure 3C:
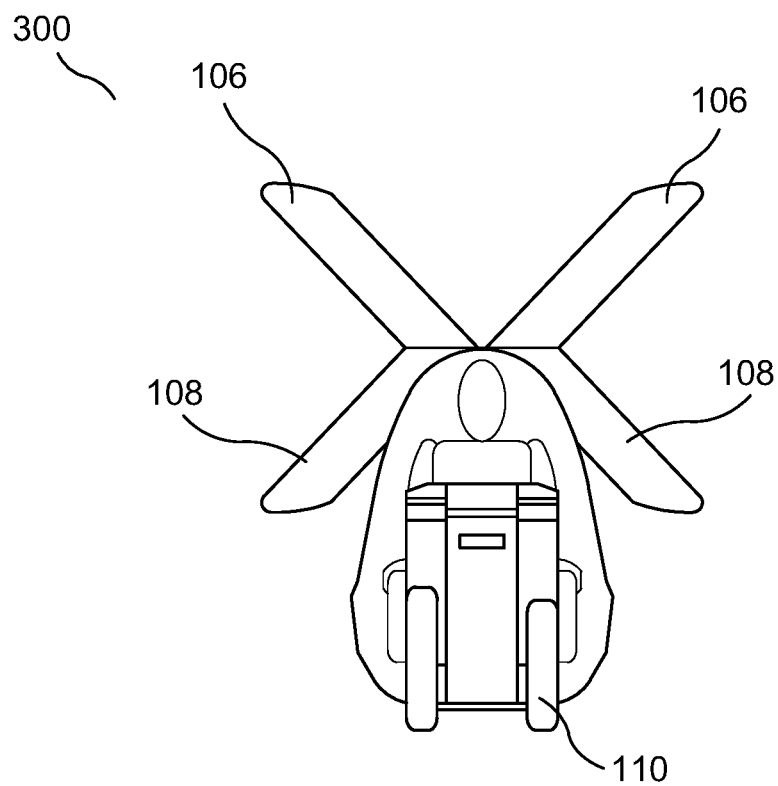
FIG. 3C is a front view of a solar extended range electric vehicle in stationary mode.
Figure 3D:
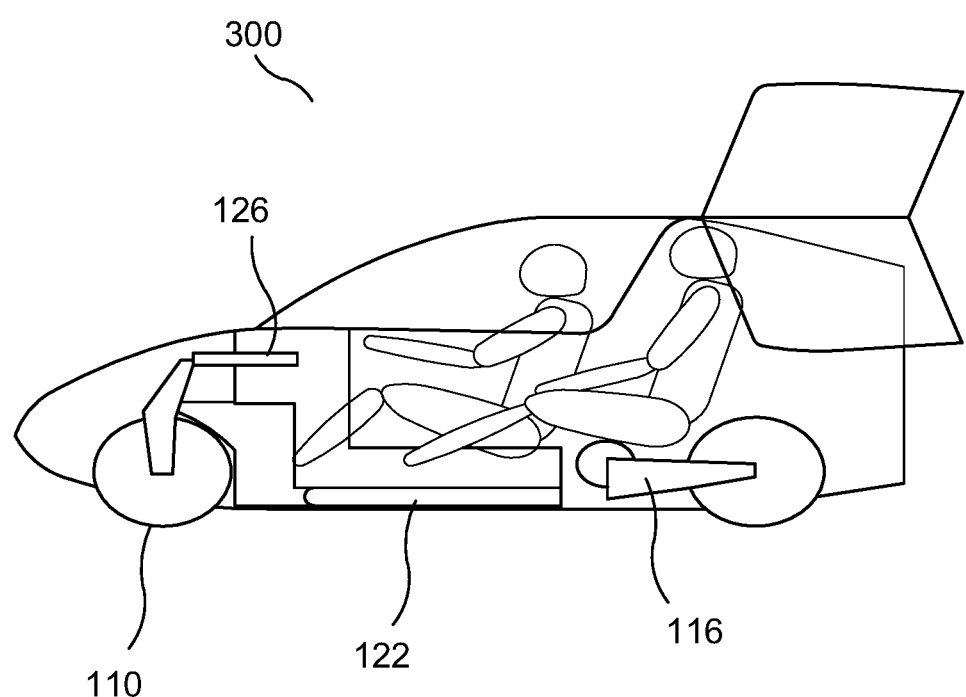
FIG. 3D is a side view of a solar extended range electric vehicle in stationary mode.

FIGS. 2A and 2D further shows the handlebar 126 steering mechanism as described in greater detail below. FIG. 2D shows a portion of prismatic battery cells 122 which are disposed under the passengers in this example. The passengers shown in FIG. 2A are behind center console 120, which may include electronics for the various components and in other embodiments, some storage area, or a combination thereof. Circuits and wiring used in the motors, wheel system and/or suspension system may be included in the center console 120 in some embodiments. In other embodiments, center console 120 may house, or be proximate to, nested wheel motors in the front of the compartment. In certain embodiments, one of nose section or tail section 160 may include modest accommodations for storage (e.g., a few grocery bags). A suspension system 116 (FIG. 1) may be mounted to body structure 112 and coupled to wheel system 110.

FIG. 3A-D are respective plan, perspective, front and side views of a solar extended range electric vehicle 300 in stationary mode. When the vehicle is stationary, such as when it is parked, it may be configured to absorb solar energy. The solar panels 106, 108 may be fully deployed. As shown in FIGS. 3A-D, the solar panels are deployed at different relative angles, enabling the panels to absorb sunlight in this configuration from one of four angles. Panels 108 may be configured to capture sunlight emitted lower on the horizon later in the day, whereas panels 106 may be more receptive to sunlight shining earlier in the day. The car may be in stationary mode anytime it is parked or otherwise not being driven. The drag introduced by the panels as deployed mean that it while it is generally undesirable in this embodiment to be mobile, other embodiments may impose a more aerodynamic design on the deployed flaps, enabling the vehicle to move as it absorbs solar energy. In other embodiments where additional solar panels may be present on the vehicle that are flush and unmoving, those additional panels may be receptive to absorbing sunlight while in the mobile mode. Further, while an array of four panels is shown in FIGS. 3A-D for purposes of illustration, other numbers of panels and other configurations are possible. Solar panels 106 or 108, or both, in another embodiment, may automatically be configured to adjust their position relative to the angle of the sun to receive maximum exposure. For example, a deployment motor may be associated with solar panels 106 and 108 that has as an input an intensity reading. In other embodiments, weather information, pictorially and/or audibly may be streamed to such a deployment motor for interpretation by a processing system. These types of predictive behavior events may substitute for or complement an input system that detects optimal radiation and radiation angles for use by solar panels 106 and 108 during the employment mode. In these embodiments, care should be taken to ensure that solar absorption is occurring at a great degree than use of energy due to solar tracking and other procedures, such that a net gain is likely to be significantly greater where the tracking methods or weather readings are used.

Figure 4A:
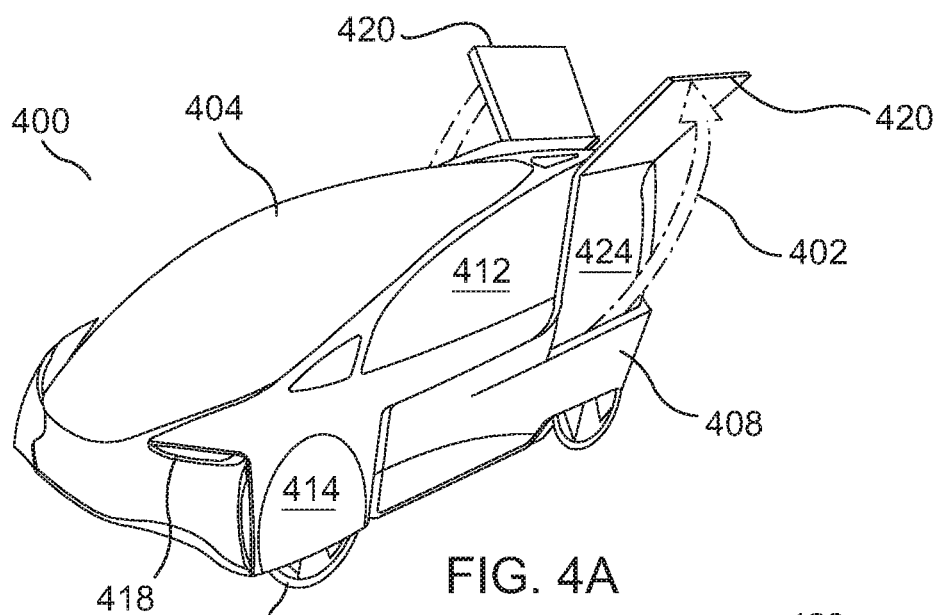
FIG. 4A is a front perspective view of a solar extended range electric vehicle illustrating the deploying of its solar panels from a position integrated along the frame.

FIG. 4A is a front perspective view of a solar extended range electric vehicle 400 deploying its solar panels 420 from a position integrated along the frame. In this embodiment, solar panels 420 are integrated along frame 408 of the vehicle by means of pockets 424. Thus, initially before the vehicle 400 transitions to stationary mode, solar panels 420 are sitting flush against an inner surface of respective pocket 424 such as in the illustration of FIG. 5. When the vehicle 400 is parked or stationary mode is otherwise engaged, an electric deployment motor (not shown) may cause solar panels 420 to deploy along the direction of arrow 402 from a position as integrated along frame 408 and substantially flush against pocket 424 to the deployed position. In other embodiments, the process of deploying solar panel 420 is a manual one, performed by a user turning a crank (not shown) or by the user simply lifting up the panel, e.g., using a tab on an external portion of solar panel 420 to pull the solar panel 420 out of pocket 424 and up into the deployed position.

FIG. 4A further shows additional features of vehicle 400 pursuant to an embodiment. Partially or fully transparent canopy 404 may be opened for passenger entry into vehicle 400. Vehicle 400 also contains windows 412 that may in certain embodiments be opened. In other embodiments, windows 412 constitute a part of canopy 404, and may open only with canopy 404. In other embodiments, windows 412 may be stationary in the closed position. A front wheel 410 includes wheel cover 414 and a rear wheel is closely arranged relative to frame 408. Vehicle 400 further includes front headlights 418 arranged in a small protrusion at the front of frame 408. It will be appreciated that the features of vehicle 400 are contoured so as to enable the vehicle 400 to be as aerodynamically biased as possible. The integration of solar panels 420 along the frame 408 in respective pockets 424 further reduces an aerodynamic drag on the vehicle 400 when the vehicle is in mobile mode.

Figure 4B:
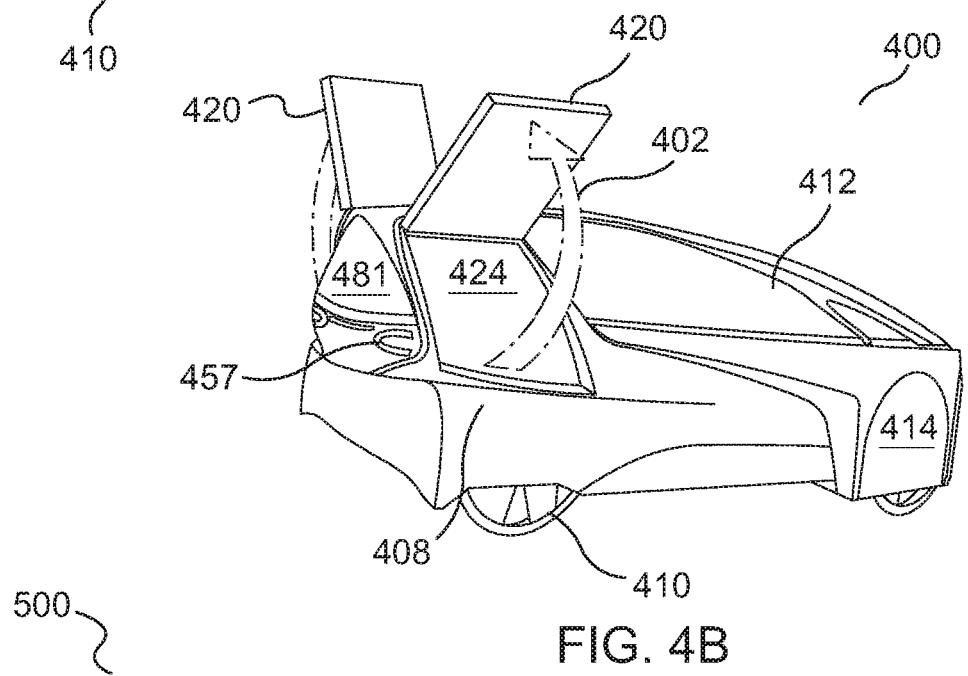
FIG. 4B is a rear perspective view of a solar extended range electric vehicle illustrating the deploying of its solar panels from a position integrated along the frame.

FIG. 4B is a rear perspective view of a solar extended range electric vehicle 400 deploying its deployed solar panels from a position integrated along the frame. FIG. 4B shows the same features as FIG. 4A, except from a rear perspective view where taillights/brake lights 457 are visible. The back end 481 of the frame is contoured in this embodiment to enable continuous uninterrupted air flow when the vehicle 400 is moving. FIG. 4B also shows a portion of window 412, which may or may not be part of canopy 404.

Figure 5:
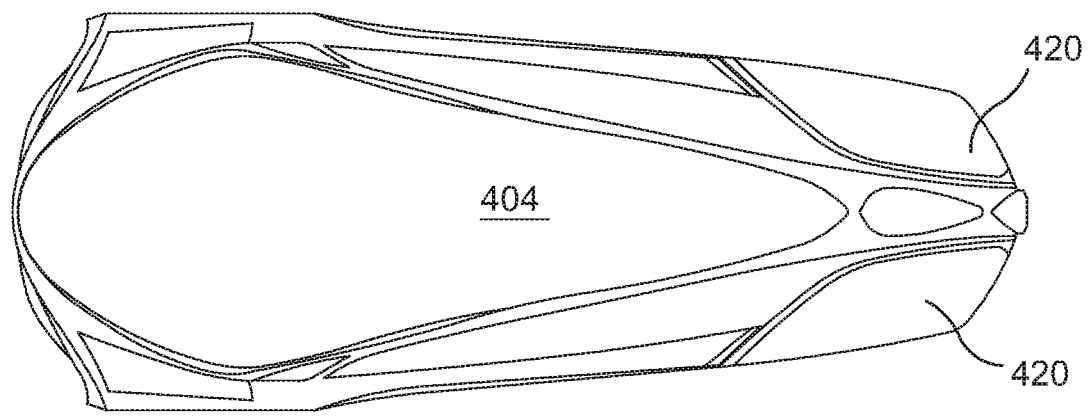
FIG. 5 is a plan view of a solar extended range electric vehicle showing a streamlined contour of the vehicle designed to reduce aerodynamic drag.

FIG. 5 is a plan view of a solar extended range electric vehicle showing a streamlined contour of the vehicle 500 designed to reduce aerodynamic drag. As is evident from the illustration, vehicle 500 in FIG. 5 is arranged in an approximately streamlined shape to reduce drag. FIG. 5 further illustrates that the wheels in this embodiment are closely coupled to the vehicle such that very little additional drag force is introduced to the vehicle's aerodynamic profile owing to the protrusion of the wheels into the air stream. FIG. 5 is a structurally distinct embodiment from the embodiment of FIGS. 4A and 4B in that a front of the vehicle has different features.

In an embodiment, the aerodynamic contour of the body as shown in the illustrations above assists not only in reducing the coefficient of drag overall, but also for enabling one of a dynamic leaning narrow track or a non-tilting wide track vehicle for turns.

Figure 6:
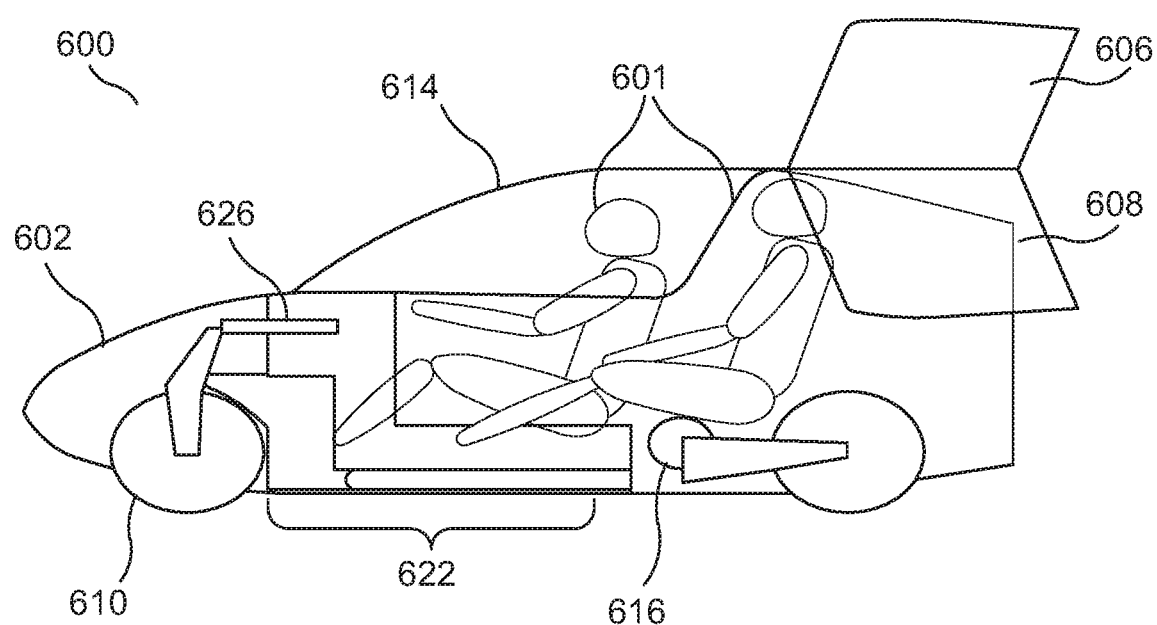
FIG. 6 is a side view showing an exemplary relative placement of passengers using inline seating in a solar extended range electric vehicle.

FIG. 6 is a side view showing an exemplary relative placement of passengers using inline seating in a solar extended range electric vehicle 600. FIG. 6 is similar to previous embodiments and shows two occupants 601 arranged in a dual inline seating configuration, an aerodynamic body 602 in which frontal surface area and drag coefficient are minimized as discussed above, and a battery assembly 622 including a collection of battery cells arranged below the occupants that may create a primary load path along a surface of the battery cells. A solar array including two panels 606 (one shown) engaged to receive more solar energy when the sun is higher and two panels 608 (one shown) engaged to receive more solar energy when the sun is lower and angled relative to the vehicle 600 are illustrated. Further shown in FIG. 6 are handlebars 626 for effecting steering and a wheel system 610 including four wheels coupled to a suspension system 616. The front nose of the vehicle 600 may in some embodiments be configured to include space for two to four storage bags, e.g., grocery bags.

Folding Solar Power Arrays for High Energy Absorption and Low Drag on Vehicles.

Adequate solar energy absorption for a solar powered vehicle to achieve range targets implies large surface area of solar conversion cells. Most conventional solar powered vehicles achieve the necessary surface area by implementing the largest possible plan area of the vehicle and installing solar cells on every available surface. However, these conventional approaches can be problematic and unpredictable. For example, many of these cells are inefficient as they provide low cross-section to the emitter during charging as the solar emitter moves across the sky, thereby driving further cost and mass into the vehicle to increase surface area for more paneling and achieve necessary energy absorption. Secondarily, the frontal area of the vehicle increases with width in plan view.

Planar arrays are the simplest implementation to achieving a given cross-section for a lowest mass, but other mostly planar arrangements may perform nearly as well from a specific mass per unit energy basis. Conformal arrays are possible, but require flexible cells and when deployed yield lower solar power due to cosine losses. Similarly, painted-on cells can yield larger surfaces, but also suffer from cosine losses. Telescoping planar arrays as described with respect to certain embodiments herein also improves solar absorption by increasing available surface area. Multi-hinged panels can also be implemented—but likely with highest mass.

Figure 7A:
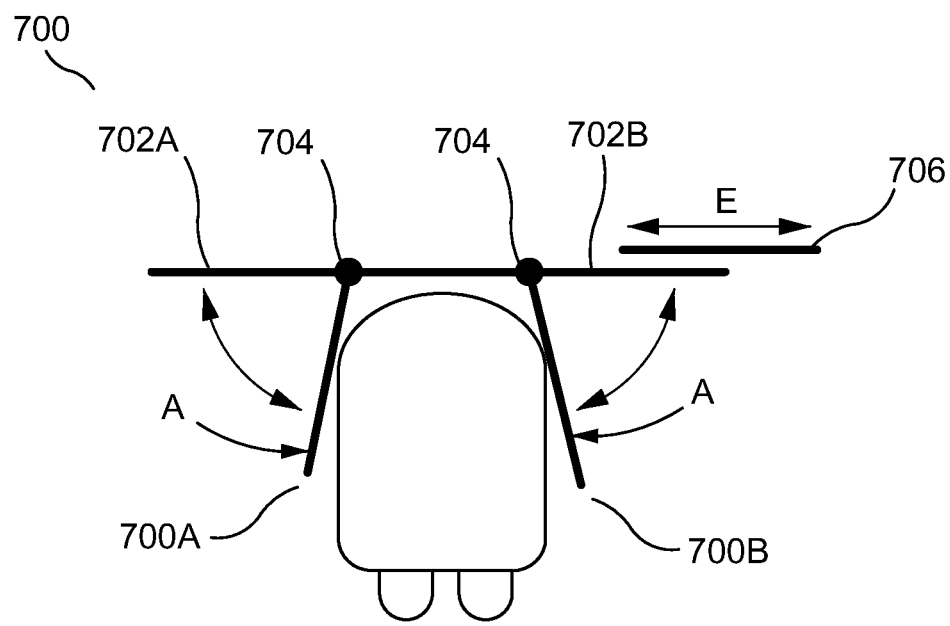
FIG. 7A is a conceptual elevation view of a solar extended range electric vehicle having deployable solar arrays.

FIG. 7A is a conceptual elevation view 700 of solar extended range electric vehicle 700 having deployable solar arrays 702A-B. Deployable solar arrays 702A-B may increase cross-sectional area in a position normal to the solar emitter (in plan or elevation view), and may further allow overall vehicle cross-section to remain small in the frontal area when the deployed solar arrays are stowed for low aerodynamic drag as previously described. In an embodiment, some solar arrays may be emitter-tracking for increased performance. However, emitter-tracking solar arrays may add some complexity, cost and mass relative to single axis tracking with a value proposition of 10-20% increased performance. In one embodiment, emitter-tracking works by using a deployment motor for adjusting position of the solar panels and a solar tracker to ensure that the solar panels always follow the sun's elevation.

Referring still to FIG. 7A, simple planar arrays with a single pivot 704 may allow an array to deploy and change available cross-section normal to the pivot axis. Thus, for example, upon parking the vehicle a deployment motor may cause the array of solar panels to deploy to an open position. When the vehicle is utilized and is in motion, the motor may further cause the panels to fold to a closed position flush with the frame. Functionally, the array size of solar panels 702A and 702B will then be limited by the planar cross-section available in elevation (side) view, especially for narrow-track vehicles. Another deployable array 700A-B nests at least two planar panels with near co-axial stowing pivot axes, such that the deployed surface area A for solar absorption is a multiple of available elevation planar cross-section. Telescopic extension E of stowed panel 706 may also enhance available area.

Figure 7B:
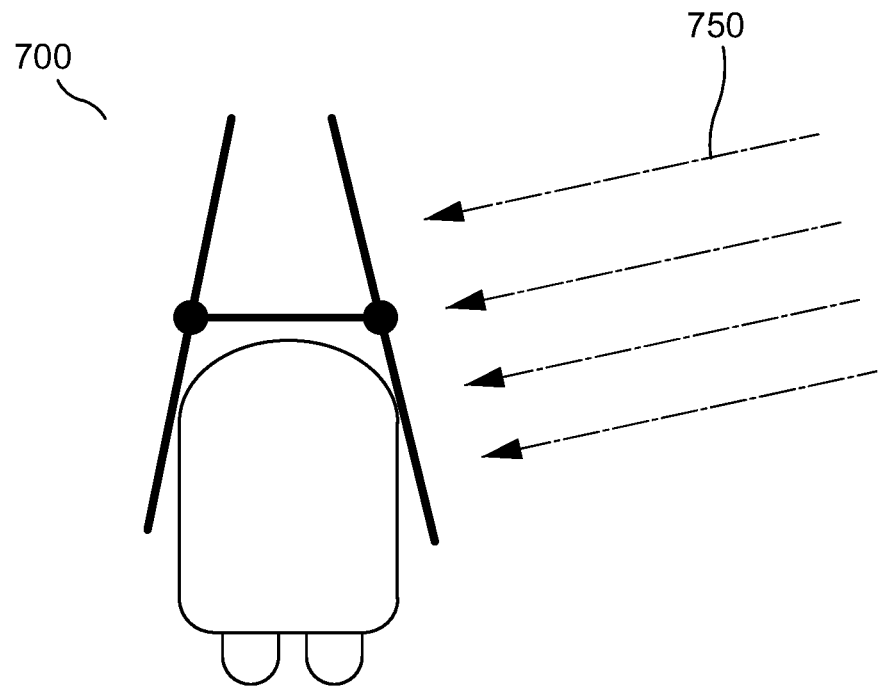
FIG. 7B is a conceptual elevation view of solar extended range electric vehicle engaged in active tracking of solar radiation

FIG. 7B is a conceptual elevation view of solar extended range electric vehicle 700 engaged in active tracking of solar radiation 750. Software-controlled active tracking of solar radiation in both elevation height and azimuth angle can maximally capture solar power when the sun is low on the horizon, with increased insolation area as compared to a single panel (assuming pivot axis is perpendicular to latitude lines). Mid-day the upper panels would actively track the sun in two axes for increased effective panel area. Also, as shown in the example of FIG. 7B, panel 700B may be arranged at a 180° angle relative to panel 702B such that panels 700B and 702B lie in the same plane. The position of this panel pair may change over time to keep the plane substantially normal to the sun's rays 150. The narrow track leaning vehicle may also use the suspension for solar tracking to lean towards the sun for maximum exposure, as described further below.

Figure 8:
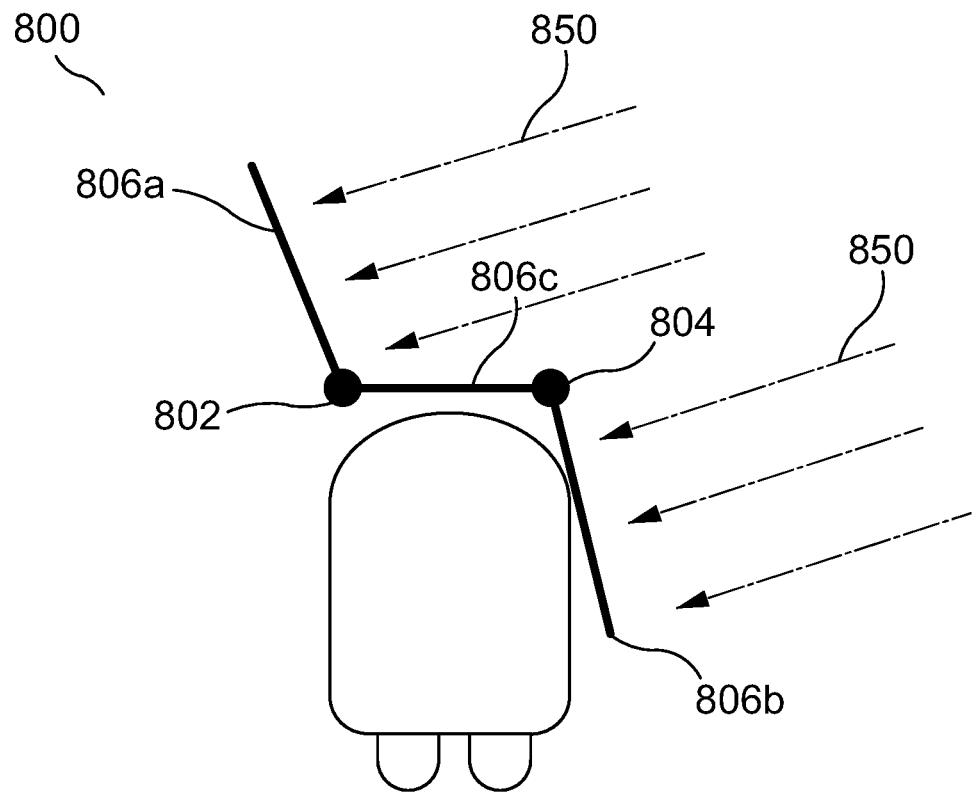
FIG. 8 is a conceptual elevation view of the solar extended range electric vehicle optimizing its positioning of solar panels in the stationary position.

In another embodiment, vehicle 700 may include a processing system (described further below) to enable the solar arrays on a vehicle to use active tracking to automatedly track the sun's rays in an optimal manner, subject to the capabilities of the configuration of the solar array. FIG. 8 is a conceptual elevation view of the solar extended range electric vehicle 800. Recognizing that the radiation is coming from the right of the image, the vehicle accordingly configures the position of solar panels 806A and 806B about its respective pivots 802 and 804 until the solar radiation is substantially orthogonal to a plane of solar panels 806A-B. Concurrent with the exposure of these panels, solar panel 806C is receiving solar radiation, albeit at an angle, but which cumulatively increases the amount of energy stored in the battery cells of vehicle 800. Panels 806a-b may automatedly adjust position in accordance with changes to the sun's position. When vehicle 800 is prepared to go into mobile mode, it may move solar panel 806A (and if necessary, solar panel 806B)) for secure and flush placement along a frame of the vehicle.

Figure 9:
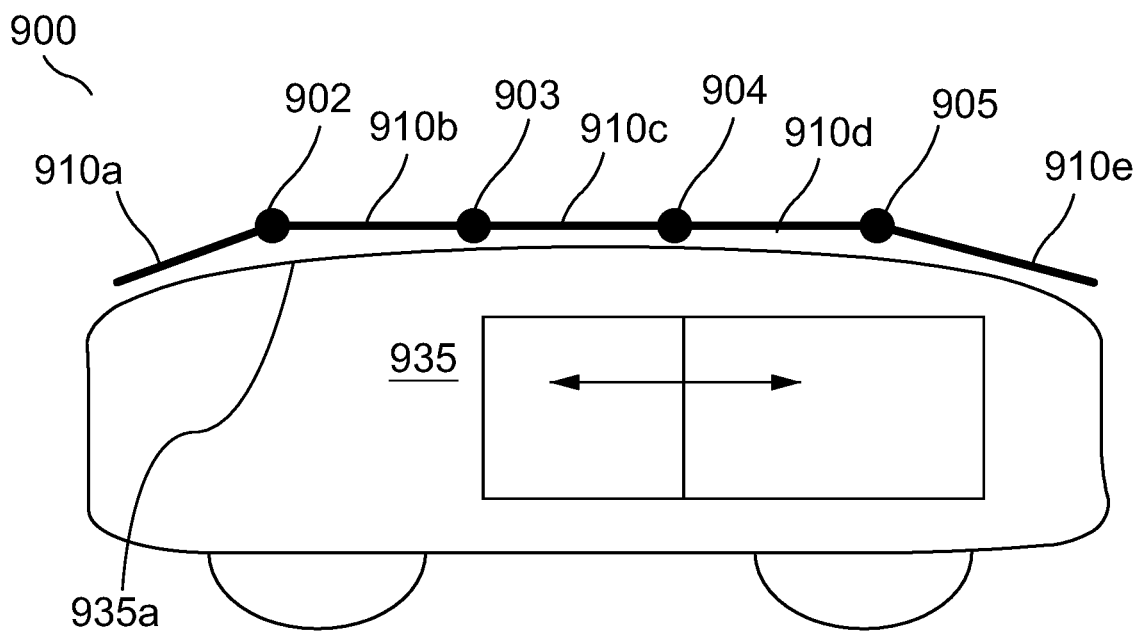
FIG. 9 is a conceptual side view of a solar extended range electric vehicle deploying an array of five panels coupled together by respective pivots extending across a surface of its frame.

In another embodiment, the arrays of solar panels may be configured to form a canopy over the vehicle for maximum exposure. FIG. 9 is a conceptual side view of a solar extended range electric vehicle 900 deploying an array of five panels 910A-E coupled together by respective pivots or other slidable connections 902-905 and extending across a surface 935A of its frame 935. In one embodiment, to enable this configuration, solar panels 910A-E may be stored under the hood panel in a folded configuration and may be deployed when the vehicle 900 is in stationary mode. In an embodiment, the telescoping of the arrays may be automated. For example, the vehicle may include a switch coupled to the processing system for deploying the solar panel array in the telescoping mode. In an embodiment, upon initiation of this mode, a panel built into the frame or body near an end of the vehicle may open and a stack of panels 910a-e may be raised upwards out of its compartment within the vehicle. Panel 910a, on the bottom of the foldable stack, may begin to extend outward along the upper surface off the vehicle until it reaches an end and stops at a connecting point between and near the edge of panels 910a and 910b, at which point panel 910b may begin to extend out of its stacked position along the vehicle surface by virtue of the force exerted on it by panel 910a at the connecting point, and so on until the stack is flush over the surface across the top of the vehicle and forms a canopy. In alternative arrangements, the top panel 910e may begin the telescoping process and lower panels may subsequently follow. In still other configurations, the stack may be a foldable stack and the panels may unfold before or while they extend.

In one embodiment, the active deployment of the solar panels may take place when the vehicle is stationary and the vehicle is placed in park. In another embodiment, the deployment may occur after the vehicle is placed in park and a separate switch is engaged.

The active deployment of the solar panels may be powered by the battery assembly and one or more deployment motors designed to rotate or otherwise translate the solar panels into an intended motion. The deployment motors may include, in an embodiment, one or more of the wheel motors used when the solar extended range vehicle is in mobile mode.

Dynamic Leaning.

Static stability is important for full-exposure controlled, aerodynamic bodywork. Stability issues are governed by the suspension system. In addition, dynamic leaning may be used in some embodiments to enable the solar panel canopy to track the emitter. Dynamic leaning may in some embodiments be performed in conjunction with a processing system that uses a GPS, solar tracker or other means for emitter tracking. The processing system may be embodied in a deployment motor or, in some embodiments, as part of an independent component.

Figure 10:
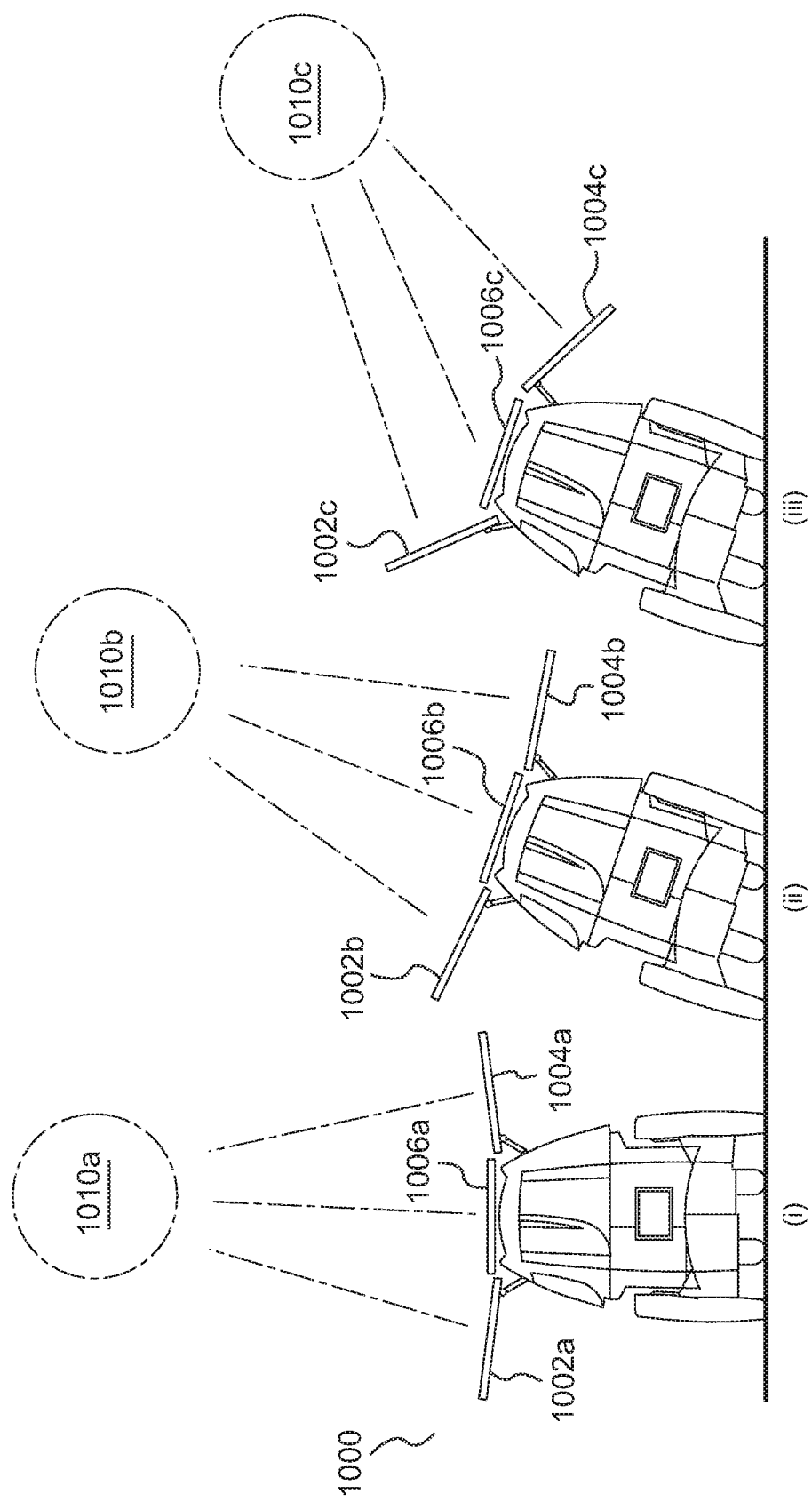
FIG. 10 is a front view of a solar extended range electric vehicle illustrating the use of suspension for dynamic leaning.

FIG. 10 is a front view of solar extended range electric vehicle 1000 illustrating the use of suspension for dynamic leaning. When the vehicle enters into stationary mode, as discussed above, arrangement (i) shows a the vehicle 1000 with a deployment motor that rotates solar panels 1002a and 1004a from the flush position along the frame to a winged position approximately parallel to the ground. In this configuration, solar panels 1002a, 1004a and 1006a are receiving rays from emitter 1010a (the sun) at an approximately normal angle.

As time passes and emitter 1010b begins to change its position in the sky, a processing system associated with the suspension system, which may include or be a component of a solar tracker or other custom processing system, is utilized in arrangement (ii) to cause the suspension system to keep the solar canopy defined by solar panels 1002b, 1004b, 1006b approximately facing the emitter 1010b such that rays from the emitter are as close as possible to orthogonal to the panels. As time continues to pass and emitter 1010c continues to change its position lower in the sky, solar panels 1002b and 1004c are rotated to track emitter 1010c as shown in arrangement (iii).

In an exemplary embodiment, processing system 1203, CPU 1277 (see FIG. 12 below), or other digital circuitry passes instructions to the applicable deployment motor(s) 1213 or associated circuits designated for receiving such instructions, and deployment motor(s) rotates the corresponding solar panels 1002c and 1004c in the rightmost image of FIG. 10, at the angles instructed. The solar panel deployment motor may be close to the panel to be deployed. In some instances, the deployment motor that actuates the solar panel and that performs the emitter tracking can be the same. In other embodiments, they may be different. It is noted that FIG. 10 illustrates the dynamic rotational capabilities of the solar panels 1002c and 1004c in stationary mode combined with the vehicle inclination capabilities provided by the dynamic leaning suspension system to achieve an optimal result. It will be appreciated, however, that the individual movement of the solar panels and the inclination of the vehicle by manipulating its suspension are both legitimate emitter tracking techniques that can be practiced alone or in combination.

In the case of FIG. 10, the dynamic leaning provided by the suspension system has an increased overall range, particularly as this attribute pertains to emitter orientations having a high azimuth angle, whereas the rotation of the solar panels on the rightmost image is an effective adjustment of the vehicle at lower azimuth angles. The result in this case is a vehicle with complementary emitter-tracking features that provide an overall increase in the absorption of solar radiation over time. In other embodiments, the importance of the panel-specific orientations may increase as a greater deployment range may be observed by the solar panels over time.

Figure 11A:
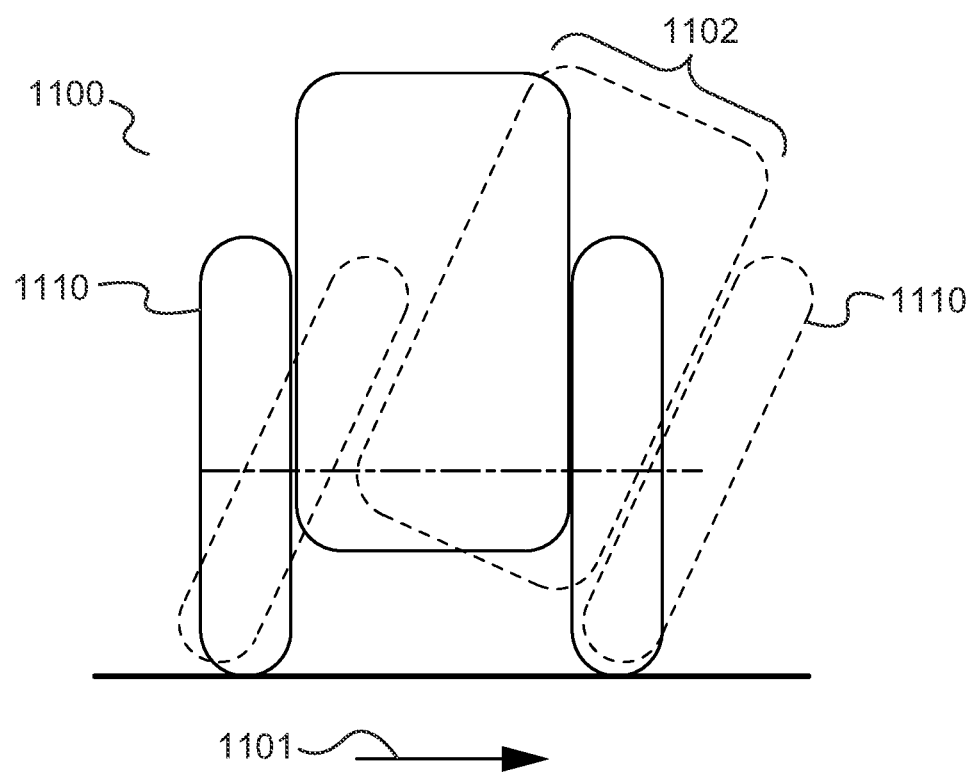
FIGS. 11A-B are elevation views of diagrams of the solar extended range electric vehicle in the dynamic leaning narrow track and non-tilting wide track modes, respectively.
Figure 11B:
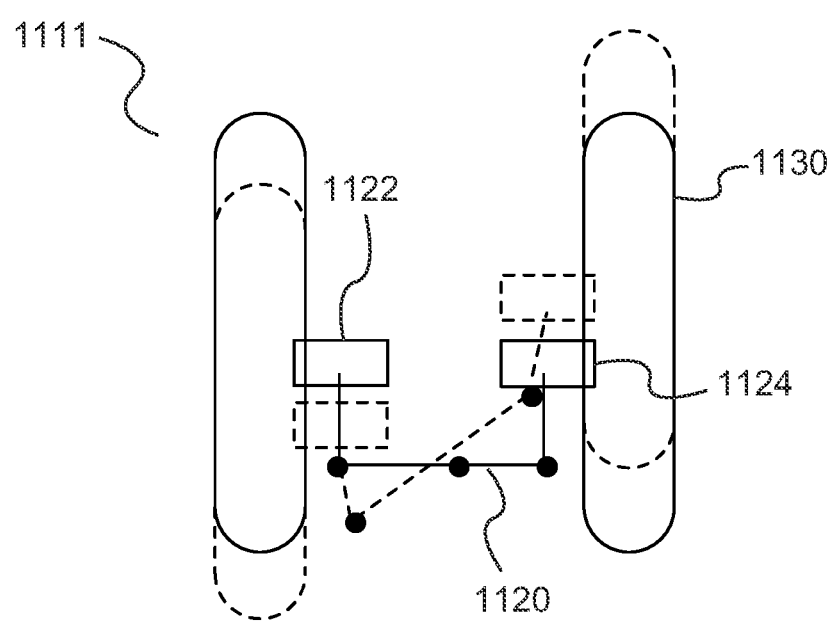

FIGS. 11A-B are elevation views of diagrams of the solar extended range electric vehicle in the dynamic leaning narrow track and non-tilting wide track modes, respectively. FIG. 11A illustrates solar extended range electric vehicle 1100 in a dynamic leaning narrow track mode. Reference 1102 depicts the dynamic leaning of the vehicle and wheel system 1110. The arrow 1101 represents the direction of leaning over time.

FIG. 11B illustrates solar extended range electric vehicle 1111 in a non-tilting wide track mode. Vehicle 1110 includes transverse link 1120, swing arm 1122, damper 1124 and wheel system 1130. The dashed lines indicate the movement of transverse link 1120, swing arm 1122 and damper 1124 over time.

Figure 12:
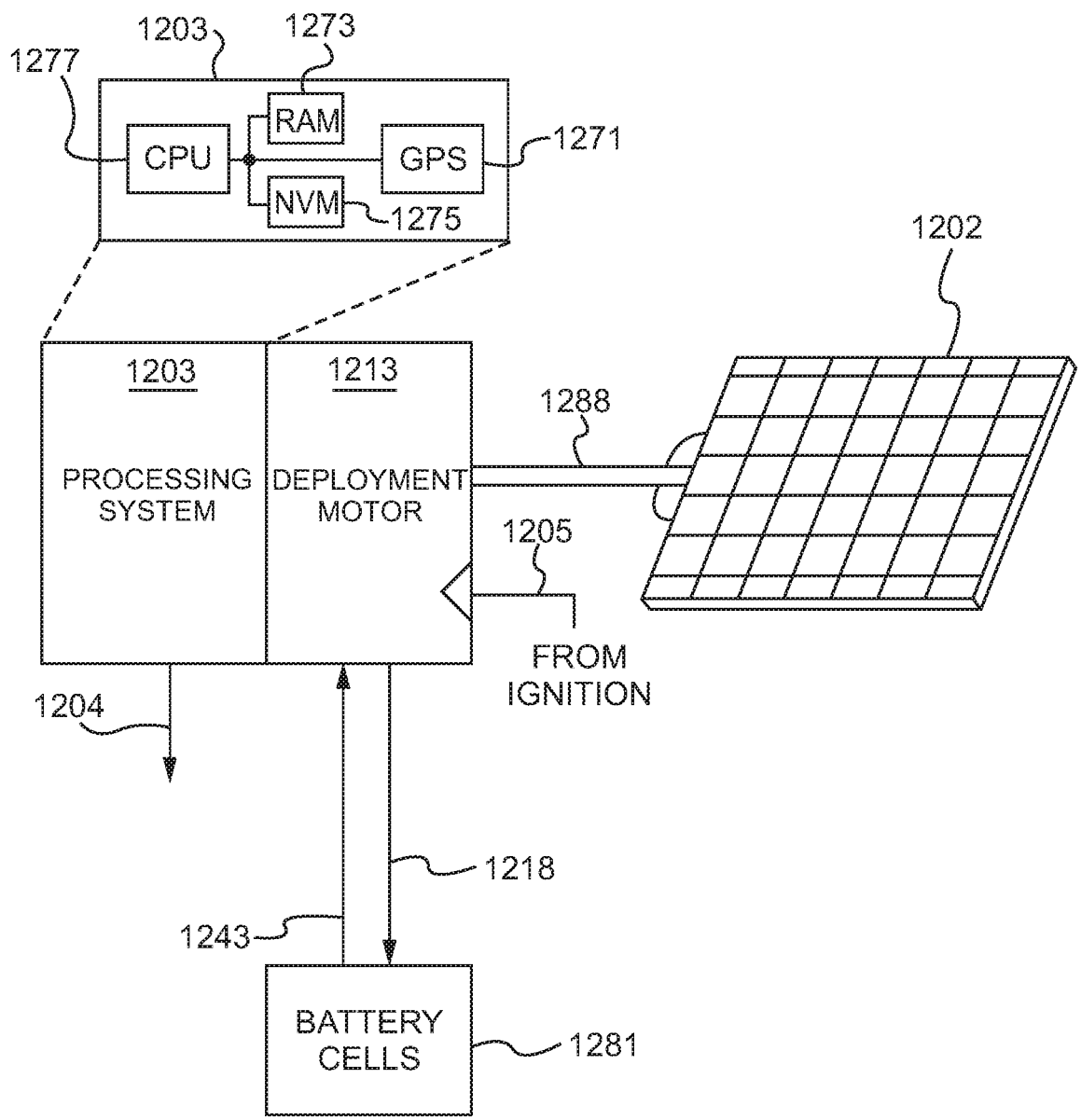
FIG. 12 is a conceptual block diagram illustrating a deployment motor and processing system and their relationships with other components of the solar extended range electric vehicle.

FIG. 12 is a conceptual block diagram illustrating a deployment motor and processing system and their relationships with other components of the solar extended range electric vehicle in accordance with the embodiment. FIG. 12 shows deployment motor 1213 which is supplied energy from battery cells 1281 via bus 1243. When stationary mode is indicated, which in this simplified embodiment means that ignition 1205 is turned off, an enable signal is provided to deployment motor 1213. Deployment motor 1213 thereupon uses the energy from the battery 1281 to turn a shaft 1288, which in turn unfolds solar panel array 1202 from an unfolded position to a fully extended position.

In other embodiments, one or more deployment motors 1213 can be used to automatedly deploy the array of solar panels to form a canopy by rotating and telescoping the solar panels as appropriate. When ignition 1205 is turned on, this signals a mobile mode in which deployment motor 1213, in turn, returns the solar panel array to its original set of flush positions for vehicle movement. In this case, solar panel array 1202 and other panels can still absorb solar energy from their respective flush positions, assuming they remain exposed to the sun at some angle.

In alternative designs, a single deployment motor may drive more than one solar panel. In addition, a single solar panel may be driven by different deployment motors based on design criteria (By way of example, one deployment may be used to deploy the solar panel(s) and another to fold the panel). One of the key design considerations for deployment motors is efficiency. The motor should be made to use as little energy as possible under different circumstances to minimize energy dedicated for panel movement in general, which can reduce the benefits achieved by the deployment and tracking methods described herein.

Like electric motors in general, deployment motor 1213 generally includes a mechanism to convert its electrical energy to mechanical energy to thereby perform the desired functions. Deployment motor may, for example, constitute a brushed or brushless DC motor, AC motor, direct drive motor, linear motor, servo motor, stepper motors, and any number of additional or alternative available motors and designs. Different deployment motors in a single device may use the same or different motors. By way of example and without limitation, one deployment motor may be used to deploy one or more solar panels and another deployment motor may be used to fold or close these panels. A key limiting design constraint on the use of motors in general for this purpose, including multiple motors, is the power required to operate such motors.

Thus, in some embodiments, the deployment motor(s) may be arranged proximal to one or more panels for increased efficiency. Additional considerations for maximizing efficiency may be implemented in other embodiments. A variety of actuator mechanisms may be associated with the deployment motor, which may provide a translational or rotational motion to the panel(s), or combination thereof, depending on the configuration of panel and intended direction of deployment.

In another embodiment, an active tracking system is employed in which one or more deployment motors 1213 can be coupled, either directly or through wiring, to a processing system 1203. An internal portion of processing system 1203 may include a central processing unit 1277 or other microcontroller, random access memory (RAM) 1273 for temporarily storing information relating to solar panel positions and emitter position, non-volatile memory 1275 which may store the programs run by CPU 1273 and, in some embodiments, a global positioning system (GPS) 1271 for use in tracking solar position, comparing solar position to the present direction of the solar panel array, and adjusting the array accordingly to maintain a maximum possible incidence of sunlight on the panels.

In one embodiment, processing system may accomplish these tasks by obtaining vehicle position information using GPS 1271, comparing the position information to the known orientation of the canopy/solar panel array as stored in RAM 1273 after every change in position made by deployment motor(s) 1213, and using the CPU to determine an optimal canopy position by comparing the expected solar position in the known area occupied by the vehicle with the known position of the canopy. In other embodiments, solar tracker may be used to accomplish these functions. In an embodiment, a GPS is not needed. For example, a magnitude of solar energy may be directly measured on the surfaces of the solar array making up the canopy. In general, a processing system which is judicious in its use of energy may be sufficient to serve all the functions described herein. In one exemplary embodiment, processing system 1203 may be reduced in architectural complexity and exchanged with a set of electric circuits that perform the same, or substantially the same, set of function, in some cases with a proportionately fewer set of power requirements.

In an exemplary embodiment, deployment motor 1213 includes one or more of the electric motors used to power the vehicle. In this case, a separate deployment motor may not be necessary. In other embodiments, deployment motor 1213 may be used to handle the rotations of solar panel 1202 in conjunction with one or more of the electric motors used to power the vehicle. Deployment motor 1213 may also be used to implement the dynamic leaning mechanism of the vehicle when in the stationary mode.

In the embodiment using a processing system 1203, at least two exemplary techniques may be used to accurately track the emitter. First, the processing system 1203 may send a signal to a corresponding circuit 1204 in the suspension system (e.g., a motor including, for example, the deployment motor or wheel motor) to cause the suspension system to incline by a predetermined amount, as discussed with reference previous embodiments. In other embodiments, this dynamic leaning need not be automated and may instead be configured to effect a gradual inclination in a specified direction after stationary mode is activated. Second, the processing system may send a message to the deployment motor 1213 to adjust solar panels such as "wing" like solar panels when such adjustment would provide a more direct line of sunlight to these wing-like panels even though, for example, the suspension system may already be at a maximum incline. See, e.g., FIG. 10, solar panels 1002*c* and 1004*c*.

A number of additional or alternative embodiments may be contemplated for emitter tracking. For example, in one exemplary embodiment, deployment motors may be integrated within one or more solar panels, or assembled adjacent the one or more solar panels, and may be configured with a minimal amount of mass and volume that uses a minimal amount of power. Alternatively, deployment motor 1213 may perform the function of processing system 1203, e.g., to enable the vehicle to integrate the various operations of these devices). In still other embodiments, the processing system may perform the function of the deployment motor, assuming that the processing system includes a mechanism (or relies on an external mechanism) to convert its electrical instructions into mechanical work that can be used for deploying and folding closed the corresponding solar panel (s). Generally, in some embodiments, the "processing system" may not directly encompass all functions or features described herein, but rather may be coupled to one or more devices with such capabilities.

It should be noted that in the embodiment shown, deployment motor 1213 is further coupled to the battery cells 1281 via another bus or wireline 1218. The function of this wireline in the embodiment shown is to store electric charge due to the absorption of solar energy from panel 1202. In this case, shaft 1288 may include a wire or other conduit for transferring the charge from solar panel 1202 (or an array of solar panels) to deployment motor 1213. In other embodiments, charge is directly transferred by a dedicated wireline to the battery without passing through the deployment motor 1213. In other embodiments, as described above, one or more wheel motor(s) may be used in whole or in part to deploy the solar array, to modify a suspension of the vehicle, or to provide some combination of both of these functions. In such an embodiment, considerations regarding, among other factors, the distance of the wheel motor to the relevant solar panel should be taken into account. This consideration may also apply to other motors configured for use over multiple solar panels or arrays thereof. In still other embodiments as described above, the processing system 1203 may instead be realized by a plurality of hardware logic and analog circuits, programmable array logic (PAL), one or more digital signal processors (DSPs) and/or a combination of hardware and software dedicated to facilitating emitter tracking and related functions (such as, for example, discontinuing such tracking when the vehicle enters the mobile mode). While the processing system 1203 is not limited to using a single processor and embodiments may be contemplated where multiple processors are desirable, considerations regarding energy use should be carefully considered in such situations.

The use of manual deployment has distinct advantages and the present disclosure is intended to include such embodiments, e.g., where a vehicle occupant performs the functions of deployment and folding upon entering respective stationary and mobile modes. Such manual use equally extends to manual positioning of arrays and/or suspension system adjustment to account further for solar direction. While the distinct advantage of manual adjustment include power savings achieved by the absence of such circuits to perform these functions, the attendant disadvantages with this procedure should be considered. For example, these activities can become monotonous and inconvenient, and an ordinary person may become less inclined over time to continue such activity. In this event, the extended range of travel can become significantly smaller, with any remaining solar range relying solely on the panels as they exist in mobile mode. Furthermore, problems with accuracy and precision are evident in any manual attempts to track the emitter. It is unlikely that the user will be regularly available to perform repositions of the array, etc. And any such modifications performed by the would likely yield further inaccuracies, since the magnitude of the adjustments and the assumptions underlying them would amount to little more than guesswork. The number of solar panels in the array, in contrast to the above conclusion that strategically-placed, low mass stowable panels accord significant advantages by enhancing overall driving range, would in this case become a liability due to the user's increased obligations to position multiple panels.

As can be seen from the above description, use of automated techniques to accomplish the above-described objectives can result in a number of tangible advantages, not the least of which is the added comfort level to an everyday driver who obtains an everyday "boost" in mileage benefits but without the everyday burden to attempt maintain them.

The solar panels may form any shape in two or three dimensions. For example, the solar panels may be rectangular, circular, triangular, or any variation or random shape. In an embodiment, the solar panels are curved or otherwise form a non-flat shape. For example, the solar panels may include a v-shape, ripples, or any other 3-dimensional attribute. Further, the solar panels may be two-sided.

The previous description is provided to enable any person skilled in the art to practice the various aspects described herein. Various modifications to the exemplary embodiments presented throughout this disclosure will be readily apparent to those skilled in the art, and the concepts disclosed herein may be applied to other solar vehicles and techniques for panel deployment and emitter tracking in solar vehicles. Thus, the claims are not intended to be limited to the exemplary embodiments presented throughout the disclosure, but are to be accorded the full scope consistent with the language claims. All structural and functional equivalents to the elements of the exemplary embodiments described throughout this disclosure that are known or later come to be known to those of ordinary skill in the art are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), or analogous law in applicable jurisdictions, unless the element is expressly recited using the phrase "means for" or, in the case of a method claim, the element is recited using the phrase "step for."

What is claimed is:

1. A solar extended-range electric vehicle, comprising:
   an array of solar panels arranged along a vehicle frame;
   a battery for storing electric charge received from the array of solar panels; and
   a deployment motor configured to deploy the array of solar panels to an open position corresponding to a stationary mode;
   wherein two solar panels in the array are arranged on a first side of the vehicle frame and are joined at a first pivot axis, and two solar panels in the array are arranged on a second side of the vehicle frame and are joined at a second pivot axis.

2. The vehicle of claim 1, wherein the deployment motor is further configured to stow at least one solar panel in the array of solar panels from the open position corresponding to the stationary mode to a closed position corresponding to a mobile mode.

3. The vehicle of claim 2, wherein the deployment motor is configured to fold at least one solar panel in the array of solar panels substantially or exactly flush with the frame upon entry into the mobile mode.

4. The vehicle of claim 1, further comprising at least one electric motor coupled to the battery for mobilizing a wheel system.

5. The vehicle of claim 1, wherein the deployment motor is configured to rotate at least one solar panel in the array of solar panels to an angle for maximizing absorption of solar energy in the stationary mode.

6. The vehicle of claim 1, wherein the deployment motor is configured to move at least one solar panel in the array of solar panels to a plurality of different orientations over time in the stationary mode.

7. The vehicle of claim 1, wherein at least one solar panel in the array of solar panels is configured to fold relative to another solar panel in the array or to a plane of the vehicle.

8. The vehicle of claim 1, wherein a plurality of solar panels in the array of solar panels are configured to fold relative to another one or more solar panels in the array or to one or more planes of the vehicle.

9. The vehicle of claim 1, wherein at least one solar panel in the array of solar panels is configured to extend telescopically from another solar panel in the array.

10. The vehicle of claim 1, wherein a plurality of solar panels in the array of solar panels configured to extend telescopically from one another.

11. The vehicle of claim 1, wherein at least one solar panel in the array of solar panels is configured to rotate about an axis.

12. The vehicle of claim 1, wherein at least one solar panel in the array of solar panels is curved.

13. The vehicle of claim 1, wherein at least one solar panel in the array of solar panels comprises a planar panel.

14. The vehicle of claim 1, wherein
   the array of solar panels includes at least two solar panels, and
   each of the at least two solar panels is coupled to the frame via a hinge.

15. The vehicle of claim 1, wherein the deployment motor is coupled to a processing system for automatically tracking solar emission in the stationary mode by rotating at least one solar panel in the array of solar panels periodically in a direction of the solar emission.

16. The vehicle of claim 1, wherein
   the deployment motor is coupled to a processing system for tracking solar emission in the stationary mode, and
   the deployment motor is configured to periodically cause to move, responsive to instructions from the processing system, one or more solar panels in the array of solar panels through at least portions of their respective deployment sweeps.

17. The vehicle of claim 16, further comprising a suspension system coupled to the frame, wherein the processing system is configured to cause the suspension system to incline in a direction of solar emission during the stationary mode.

18. The vehicle of claim 1, further comprising:
   a suspension system coupled to the frame; and
   a processing system configured to cause the suspension system to incline in a direction of solar emission during the stationary mode.

19. The vehicle of claim 1, wherein
   the deployment motor is configured to orient the array of solar panels into a canopy that forms over at least a region of the vehicle.

20. The vehicle of claim 19, wherein the canopy is oriented by at least one of rotational movements and telescoping movements.

21. The vehicle of claim 19, wherein the deployment motor is further configured to stow the array of solar panels from the open position corresponding to the stationary mode to a closed position corresponding to a mobile mode, and wherein solar panels of the array are configured in the mobile mode to stack at least partially atop one another.

22. The vehicle of claim 21, wherein the array of solar panels is stored in an upper region of a vehicle front storage compartment during the mobile mode.

23. The vehicle of claim 21, wherein the deployment motor is configured to deploy the array of solar panels longitudinally across at least a portion of an exterior surface of the vehicle during the stationary mode.

24. The vehicle of claim 23, wherein the deployment motor is configured to initiate deployment of the array of solar panels by rotating the array at an angle sufficient to enable completion of deployment using telescoping movements of the individual solar panels.

25. A solar extended-range electric vehicle, comprising:
   an array of solar panels arranged along a vehicle frame;
   a battery for storing electric charge received from the array of solar panels; and
   at least one deployment motor configured to deploy the array of solar panels to an open position corresponding to a stationary mode and to stow the array of solar panels from the open position to a closed position corresponding to a mobile mode;
   wherein the at least one deployment motor is configured to orient the array into a canopy that forms over at least a region of the vehicle;

wherein solar panels of the array are configured in the mobile mode to stack at least partially atop one another;

wherein the at least one deployment motor is configured to telescopically extend a lowermost solar panel of the stack before extending a second lowermost solar panel of the stack, the latter of which the at least one deployment motor is configured to extend before extending a third lowermost solar panel of the stack when a third lowermost solar panel is present, and to repeat deployment using this order and hierarchy until a top panel of the stack is extended in the canopy over at least a portion of the vehicle.

\* \* \* \* \*